(12) United States Patent
Gould et al.

(10) Patent No.: US 10,579,753 B2
(45) Date of Patent: Mar. 3, 2020

(54) EXECUTABLE LOGIC FOR PROCESSING KEYED DATA IN NETWORKS

(71) Applicant: Ab Initio Technology LLC, Lexington, MA (US)

(72) Inventors: Joel Gould, Arlington, MA (US); Scott Studer, Georgetown, MA (US); Craig W. Stanfill, Lincoln, MA (US)

(73) Assignee: Ab Initio Technology LLC, Lexington, MA (US)

( * ) Notice: Subject to any disclaimer, the term of this patent is extended or adjusted under 35 U.S.C. 154(b) by 517 days.

(21) Appl. No.: 15/376,129

(22) Filed: Dec. 12, 2016

(65) Prior Publication Data

US 2017/0344672 A1    Nov. 30, 2017

Related U.S. Application Data

(60) Provisional application No. 62/340,825, filed on May 24, 2016.

(51) Int. Cl.
*G06G 7/62* (2006.01)
*G06F 17/50* (2006.01)
*G06F 16/2455* (2019.01)
*G06F 11/36* (2006.01)

(52) U.S. Cl.
CPC ...... *G06F 17/5009* (2013.01); *G06F 11/3672* (2013.01); *G06F 16/24565* (2019.01); *G06F 16/24568* (2019.01)

(58) Field of Classification Search
CPC .................................................. G06F 17/5009
USPC ..................................................... 703/26, 13
See application file for complete search history.

(56) References Cited

U.S. PATENT DOCUMENTS

| 5,966,072 A | 10/1999 | Stanfill et al. |
| 6,782,390 B2 | 8/2004 | Lee et al. |
| 7,472,101 B2 | 12/2008 | Aurora et al. |
| 8,219,852 B2 | 7/2012 | Lind et al. |
| 8,484,230 B2 | 7/2013 | Harnett et al. |
| 2002/0083103 A1 | 6/2002 | Balance et al. |

(Continued)

FOREIGN PATENT DOCUMENTS

| EP | 2348416 | 7/2011 |
| WO | 2001/29692 | 4/2001 |

OTHER PUBLICATIONS

SMCube—State Machine Editor, http://www.e4coder.com/content/smcube-state-machine-editor[Apr. 28, 2016 12:41:48 PM] (3 pages).

(Continued)

*Primary Examiner* — Hugh M Jones
(74) *Attorney, Agent, or Firm* — Fish & Richardson P.C.

(57) ABSTRACT

A method implemented by a data processing system for processing data items of a stream of data items, including: accessing a specification that represents the executable logic, wherein a state of the specification for a particular value of the key specifies one or more portions of the executable logic that are executable in that state; receiving, over an input device or port, data items of a stream of data; for a first one of the data items of the stream, identifying a first state of the specification for a value of the key associated with that first one of the data items; processing, by the data processing system, the first one of the data items according to one or more portions of executable logic that are represented in the specification as being associated with the first state.

20 Claims, 17 Drawing Sheets

(56) References Cited

U.S. PATENT DOCUMENTS

2015/0095752 A1     4/2015   Studer et al.
2016/0062776 A1     3/2016   Stanfill et al.

OTHER PUBLICATIONS flexbe/Tutorials/Using the Statemachine Editor—ROS Wiki Page, http://wiki.ros.org/flexbe/Tutorials/Using%20the%20Statemachine%20Editor?action=print [Apr. 28, 2016] (5 pages).

Business state machine editor, http://www.ibm.com/support/knowledgecenter/api/content/nl/en-us/SSB24A_6.1.0/com.ibm.wbit.610.help.ae.ui.doc/topics/c . . . [Apr. 28, 2016] (2 pages).

UML State Machine Diagrams, http://www.altova.com/umodel/state-diagrams.html [Mar. 1, 2016] 1 page.

Why developers should be force-fed state machines, https://engineering.shopify.com/17488160-why-developers-should-be-force-fed-state-machines [Mar. 14, 2016 1:52:27 PM] (4 pages).

Samza—State Management, https://samza.apache.org/learn/documentation/0.7.0/container/state-management.html[Mar. 14, 2016 1:52:50 PM] (15 pages).

Why Developers Never Use State Machines, http://www.skorks.com/2011/09/why-developers-never-use-state-machines/[Mar. 14, 2016 1:54:53 PM] (16 pages).

TIBCO, Event Processing with State Machines, Whitepaper 2 (6 pages).

Pontis, Pontis Engage for Engaging Results, http://www.pontis.com/product/ [Apr. 14, 2016] (9 pages).

International Search Report and Written Opinion issued in PCT/US2017/033978, dated Sep. 25, 2017, 17 pp.

Gianpaolo Cugola et al., "Processing of Flows of Information", ACM Computing Surveys (CSUR), Jun. 14, 2012, pp. 1-62 XP055092334.

International Preliminary Report on Patentability issued in PCT/US2017/033978, dated Dec. 6, 2018 10 pp.

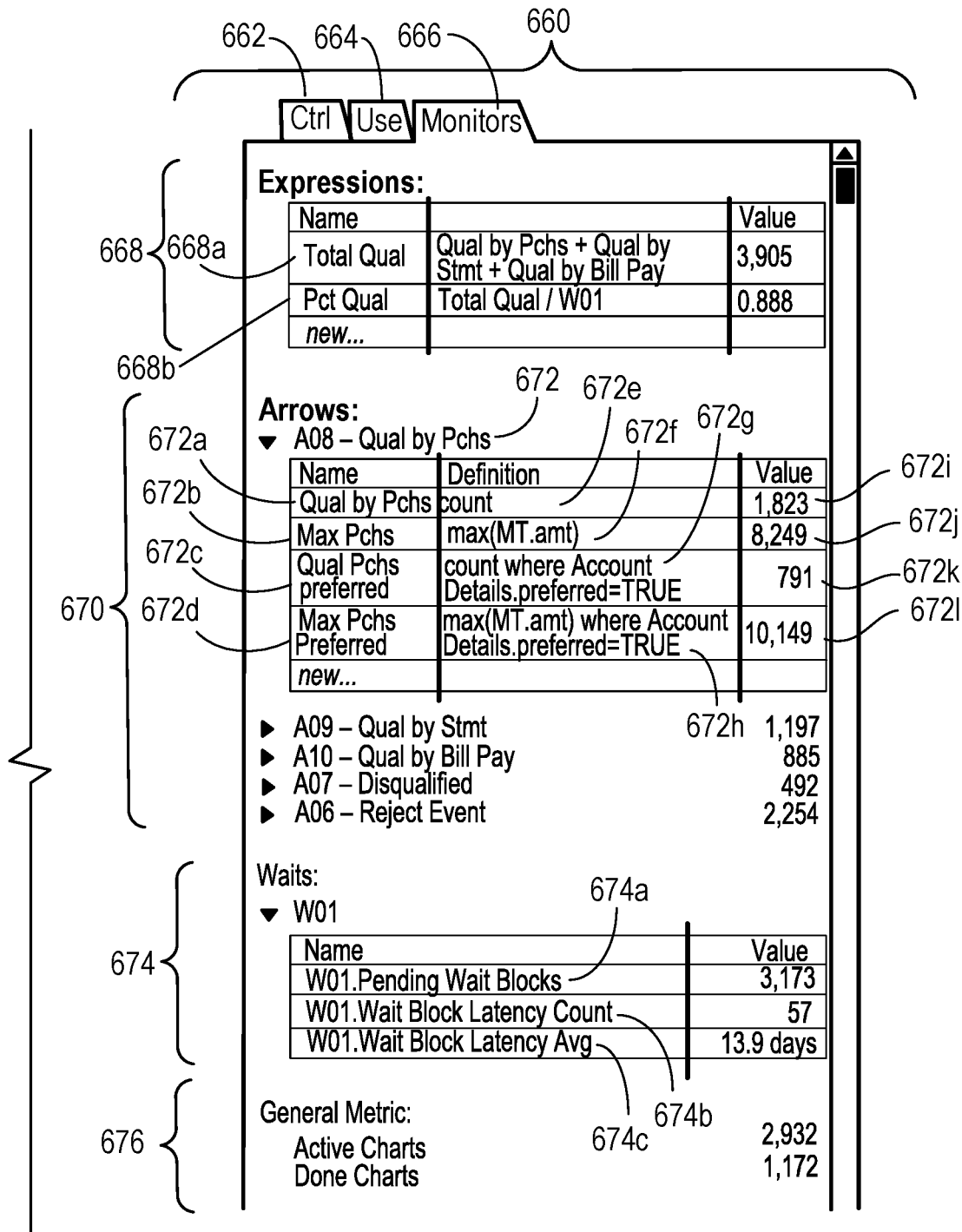
FIG. 6 (Con't)

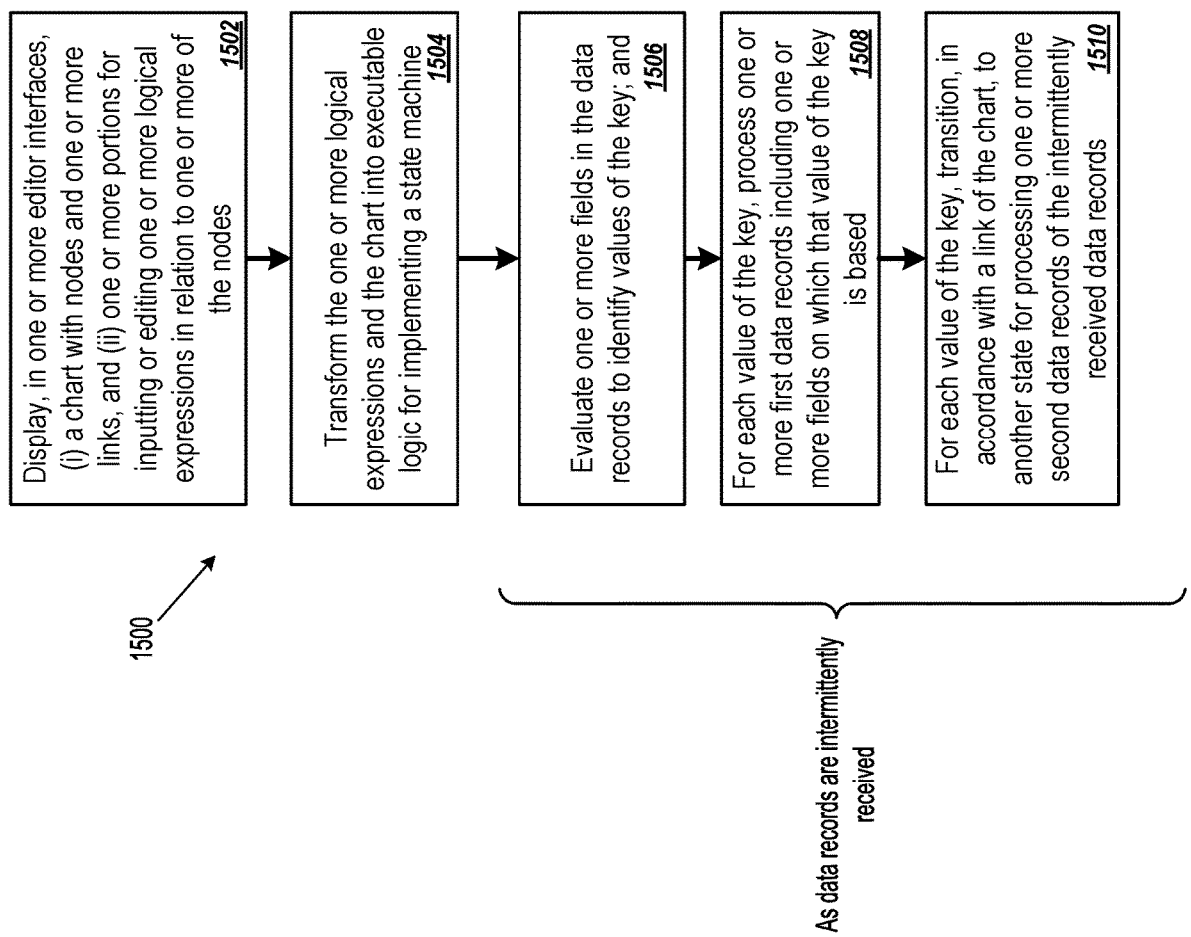

EXECUTABLE LOGIC FOR PROCESSING KEYED DATA IN NETWORKS

TECHNICAL FIELD

The present description relates to computer-implemented methods, data processing systems and machine-readable hardware storage devices for operating and adjusting executable logic that is currently applied to one or more data items in a stream of data items, e.g., data items coming in via a network connection from networked applications.

CLAIM OF PRIORITY

This application claims priority under 35 U.S.C. § 119(e) to provisional U.S. Patent Applications 62/340,825, filed on May 24, 2016, the entire contents of which are hereby incorporated by reference.

BACKGROUND

Generally, a system receives a stream of records and uses one or more rules to process each record independently of each other. As such, the rules only take the current record as input and output results for processing that record. When the system tests the rules, the testing is performed by applying one or more rules to a record, and the results of testing are shown only for that record. Usually, a software developer develops an application, which is then forwarded to a person testing the developed application. This may go back and forth several times until the approved application is released to the end-user. The end-user may have a request for a change of the application, and the end-user has to submit this request to the provider, who will then again involve the software developer and the testing person, who then tries to find a solution to incorporate the requested change. However, this may take several round-trips and does not allow at all that the end user performs any modifications.

SUMMARY

The present description relates to computer-implemented methods, data processing systems and machine-readable hardware storage devices that allow assisting an end-user in quickly (e.g., on-the fly) and properly operating and adjusting executable logic that is currently applied to one or more data items in a stream of data items, e.g., data items coming in via a network connection from networked applications. In this way, the end-user is credibly assisted in properly operating the underlying technical system without the need to involve application developers and testing persons in the checking or the adjusting of the executable logic. This may also reduce the costs and time needed to perform this checking and adjusting of the executable logic and the end user thereby also gains flexibility and control.

In a general aspect 1, described is a computer-implemented method for processing data items of a stream of data items according to a specification that is associated with a key, wherein a data item is associated with a value of the key, wherein states of the specification are maintained for respective values of the key, wherein the specification represents executable logic being stored in a data storage system, the method including: accessing the specification that represents the executable logic, wherein a state of the specification for a particular value of the key specifies one or more portions of the executable logic that are executable in that state; receiving, over an input device or port, data items of a stream of data; for a first one of the data items of the stream, identifying a first state of the specification for a value of the key associated with that first one of the data items; processing, by a data processing system, the first one of the data items according to one or more portions of executable logic that are represented in the specification as being associated with the first state, the processing including: causing display of one or more portions of the specification; applying the one or more portions of the executable logic to the first one of the data items to obtain result data; causing display of at least a portion of the result data with at least one of the one or more portions of the specification displayed; and causing the specification, with respect to the value of the key for the first one of the data items, to transition from the first state to a second state.

In an aspect 2 according to aspect 1, the method further includes executing the executable logic.

In aspect 3 according to any one of aspects 1 to 2, the one or more portions of the executable logic include one or more first portions of the executable logic, wherein the one or more portions of the specification include a first portion of the specification, wherein the result data includes first result information, the method including: executing the executable logic; as the executable logic continues being executed, receiving a second one of the data items that is later in the stream than the first one of the data items and is also associated with the value of the key; based on the transition from the first state to the second state, processing the second one of the data items according to one or more second portions of the executable logic associated with the second state, wherein the one or more second portion of the executable logic are expressed as a second portion of the specification; based on the processing, obtaining second result data indicative of one or more results of processing the second one of the data items; and causing display of at least a portion of the second result data with the second portion of the specification.

In an aspect 4 according to any one of aspects 1 to 3, the method further includes: accessing sets of items of test data; and from a selected one of the sets, simulating a stream of near real-time test data having a first item of test data that appears before a second item of test data.

In an aspect 5 according to any one of aspects 1 to 4, wherein receiving the stream of data items includes receiving the simulated stream.

In an aspect 6 according to any one of aspects 1 to 5, the method includes testing a degree of accuracy of execution of a rule expressed by the specification by applying the one or more portions of the executable logic to the first one of the data items.

In an aspect 7 according to any one of aspects 1 to 6, the testing of a degree of accuracy of execution of a rule includes one or more of determining that a portion of the first one of the data items is not processed by the data processing system, determining that a conflict between portions of the rule exist, determining that a portion of the rule specifies a condition that is unlikely to be satisfied for the first one of the data items, and determining that a portion of the rule processes a portion of the first one of the data items in a manner that differs from a targeted processing goal.

In an aspect 8 according to any one of aspects 1 to 7, the value of the key includes a first value, and the method includes: selecting, from the sets of test data, a set associated with a second value of the key; and executing, on a stream being simulated using test data in the set for the second key, an instance of the executable logic for the second value of the key.

In an aspect 9 according to any one of aspects 1 to 8, method includes causing display of a visual representation of a transition from the portion of the specification that represents the first state of the executable logic to the other portion of the specification that represents the second state.

In an aspect 10 according to any one of aspects 1 to 9, the method includes receiving a user selection of the first one of the data items of the stream; causing display of an indication of the first one of the data items of the stream currently being processed by the data processing system; and causing display of an indication of the one or more portions of the executable logic currently being applied to the first one of the data items to obtain the result data.

In an aspect 11 according to any one of aspects 1 to 10, the method includes comparing the portion of the result data with predetermined reference data; determining if a deviation exists between the portion of the result data and the predetermined reference data or if such a deviation does not exist; and outputting an indication whether the portion of the result data is in agreement with the predetermined reference data based on the determining if a deviation exists between the portion of the result data and the predetermined reference data or if such a deviation does not exist.

In an aspect 12 according to any one of aspects 1 to 11, the method includes comparing the first one of the data items of the stream currently being processed by the data processing system with a predetermined reference data item; determining if a deviation exists between the first one of the data items of the stream currently being processed and the predetermined reference data item or if such a deviation does not exist; and outputting an indication whether the first one of the data items of the stream currently being processed is in agreement with the predetermined reference data item based on the determining if a deviation exists between the first one of the data items of the stream currently being processed and the predetermined reference data item or if such a deviation does not exist.

In an aspect 13 according to any one of aspects 1 to 12, the method includes comparing the one or more portions of the executable logic currently being applied to the first one of the data items to obtain the result data with a predetermined reference executable logic; determining if a deviation exists between the one or more portions of the executable logic currently being applied to the first one of the data items and the predetermined reference executable logic or if such a deviation does not exist; and outputting an indication whether the or more portions of the executable logic currently being applied to the first one of the data items to obtain the result data is in agreement with the predetermined reference executable logic based on the determining if a deviation exists between the one or more portions of the executable logic currently being applied to the first one of the data items and the predetermined reference executable logic or if such a deviation does not exist.

In a general aspect 14, a data processing system for processing data items of a stream of data items according to a specification that is associated with a key, wherein a data item is associated with a value of the key, wherein states of the specification are maintained for respective values of the key, wherein the specification represents executable logic being stored in a data storage system, the data processing system including: one or more processing devices; and one or more machine-readable hardware storage devices storing instructions that are executable by the one or more processing devices to perform operations including: accessing the specification that represents the executable logic, wherein a state of the specification for a particular value of the key specifies one or more portions of the executable logic that are executable in that state; receiving, over an input device or port, data items of a stream of data; for a first one of the data items of the stream, identifying a first state of the specification for a value of the key associated with that first one of the data items; processing, by a data processing system, the first one of the data items according to one or more portions of executable logic that are represented in the specification as being associated with the first state, the processing including: causing display of one or more portions of the specification; applying the one or more portions of the executable logic to the first one of the data items to obtain result data; and causing display of at least a portion of the result data with at least one of the one or more portions of the specification displayed; causing the specification, with respect to the value of the key for the first one of the data items, to transition from the first state to a second state.

In a general aspect 15, one or more machine-readable hardware storage devices storing instructions for processing data items of a stream of data items according to a specification that is associated with a key, wherein a data item is associated with a value of the key, wherein states of the specification are maintained for respective values of the key, wherein the specification represents executable logic being stored in a data storage system, wherein the instructions are executable by one or more processing devices to perform operations including: accessing the specification that represents the executable logic, wherein a state of the specification for a particular value of the key specifies one or more portions of the executable logic that are executable in that state; receiving, over an input device or port, data items of a stream of data; for a first one of the data items of the stream, identifying a first state of the specification for a value of the key associated with that first one of the data items; processing, by a data processing system, the first one of the data items according to one or more portions of executable logic that are represented in the specification as being associated with the first state, the processing including: causing display of one or more portions of the specification; applying the one or more portions of the executable logic to the first one of the data items to obtain result data; and causing display of at least a portion of the result data with at least one of the one or more portions of the specification displayed; causing the specification, with respect to the value of the key for the first one of the data items, to transition from the first state to a second state.

In a general aspect 16, a method implemented by a data processing system for processing data items of a stream of data items according to a specification that is associated with a key, wherein a data item is associated with a value of the key, wherein states of the specification are maintained for respective values of the key, and wherein the specification represents executable logic being stored in a data storage system, the method including: accessing the specification that represents the executable logic, wherein a state of the specification for a particular value of the key specifies one or more portions of the executable logic that are executable in that state; receiving, over an input device or port, data items of a stream of data; for a first one of the data items of the stream, identifying a value of the key associated with that first one of the data items; identifying that the specification is associated with a wait state for that value of the key, wherein the wait state includes a state in which the executable logic is configured to wait for one or more data items that are associated with that value of the key and that are separated in time from one or more other data items that are located before the one or more data items in the stream;

processing, with at least one processor, the first one of the data items according to one or more portions of executable logic that are represented in the specification as being associated with the wait state; and causing display of at least a portion of data indicative of a result of the processing of the first one of the data items according to one or more portions of executable logic associated with the wait state.

In an aspect 17 according to aspect 16, the specification includes a flowchart with a plurality of nodes, wherein at least one of the nodes includes a wait node that represents the wait state, and wherein the flowchart includes a link between a first one of the nodes and a second one of the node, wherein the link represents a transition of the executable logic from executing one or more first portions of the executable logic represented by the first one of the nodes to executing one or more second portions of the executable logic represented by the second one of the nodes.

In an aspect 18 according to any one of aspects 16 to 17, the method further includes: generating data for a graphical user interface that when rendered on a display device includes a start control for executing the flowchart and also includes the flowchart; receiving data indicative of selection of the start control; responsive to the received data, executing the flowchart by performing operations including: executing the one or more first portions of the executable logic represented by the first node on the first one of the data items; and causing the graphical user interface to be updated to display result data indicative of a result of processing the first one of the data items with the one or more first portions of the executable logic represented by the first node, wherein the result data is displayed in juxtaposition to the first node in the flowchart.

In an aspect 19 according to any one of aspects 16 to 18, the data for the graphical user interface includes data for displaying a stop control, and the method includes receiving data indicative of a selection of the stop control; and pausing execution of the flowchart.

In an aspect 20 according to any one of aspects 16 to 19, the data for the graphical user interface includes data for displaying a test control, the method including: receiving data indicative of a selection of the test control; and testing performance of the flowchart by performing operations including: for each node in the flowchart, causing a display of data, in the flowchart, indicative of which data items of the stream and associated with the value of the key are processed by one or more portions of executable logic represented by that node.

In an aspect 21 according to any one of aspects 16 to 20, the method including causing in near real-time, with respect to receipt of each data item associated with the value of the key, the display of data, in the flowchart, indicative of which data items of the stream and associated with the value of the key are processed by one or more portions of executable logic represented by that node.

In a general aspect 22, a data processing system for processing data items of a stream of data items according to a specification that is associated with a key, wherein a data item is associated with a value of the key, wherein states of the specification are maintained for respective values of the key, and wherein the specification represents executable logic being stored in a data storage system, the data processing system including: one or more processing devices; and one or more machine-readable hardware storage devices storing instructions that are executable by the one or more processing devices to perform operations including: accessing the specification that represents the executable logic, wherein a state of the specification for a particular value of the key specifies one or more portions of the executable logic that are executable in that state; receiving, over an input device or port, data items of a stream of data; for a first one of the data items of the stream, identifying a value of the key associated with that first one of the data items; identifying that the specification is associated with a wait state for that value of the key, wherein the wait state includes a state in which the executable logic is configured to wait for one or more data items that are associated with that value of the key and that are separated in time from one or more other data items that are located before the one or more data items in the stream; processing, with at least one processor, the first one of the data items according to one or more portions of executable logic that are represented in the specification as being associated with the wait state; and causing display of at least a portion of data indicative of a result of the processing of the first one of the data items according to one or more portions of executable logic associated with the wait state.

In a general aspect 23, one or more machine-readable hardware storage devices storing instructions for processing data items of a stream of data items according to a specification that is associated with a key, wherein a data item is associated with a value of the key, wherein states of the specification are maintained for respective values of the key, and wherein the specification represents executable logic being stored in a data storage system, wherein the instructions are executable by one or more processing devices to perform operations including: accessing the specification that represents the executable logic, wherein a state of the specification for a particular value of the key specifies one or more portions of the executable logic that are executable in that state; receiving, over an input device or port, data items of a stream of data; for a first one of the data items of the stream, identifying a value of the key associated with that first one of the data items; identifying that the specification is associated with a wait state for that value of the key, wherein the wait state includes a state in which the executable logic is configured to wait for one or more data items that are associated with that value of the key and that are separated in time from one or more other data items that are located before the one or more data items in the stream; processing, with at least one processor, the first one of the data items according to one or more portions of executable logic that are represented in the specification as being associated with the wait state; and causing display of at least a portion of data indicative of a result of the processing of the first one of the data items according to one or more portions of executable logic associated with the wait state.

In a general aspect 24, a method performed by a data processing system for implementing a state machine, wherein the state machine is configured to process, for each value of a key, data records that are associated with that value, includes displaying, in one or more editor interfaces, (i) a chart with nodes and one or more links, and (ii) one or more portions for inputting or editing one or more logical expressions in relation to one or more of the nodes, wherein the one or more of the nodes correspond to a particular state of the state machine, and wherein a logical expression represents at least partial processing of a data record when the state machine is in the particular state; wherein a link between one of the nodes and another one of the nodes represents a transition of the state machine from one state to another state; transforming the one or more logical expressions and the chart into executable logic for implementing a state machine for: as data records are intermittently received, evaluating one or more fields in the data records to identify values of the key; and for each value of the key, processing one or more first data records including one or more fields on which that value of the key is based, with the processing being in accordance with one or more logical expressions that are in relation to one or more nodes corresponding to a current state of the state machine, with respect to that value of the key; and transitioning, in accordance with a link of the chart, to another state for processing one or more second data records of the intermittently received data records, wherein the one or more second data records include the one or more fields on which that value of the key is based, and wherein the one or more second data records are received after the one or more first data records.

In an aspect 25 according to aspect 24, the method includes prior to receipt of data records, executing the executable logic.

In an aspect 26 according to any one of aspects 24 to 25, the method further includes: for each value of the key, saving a state of the executable logic reached by processing the one or more first data records; and continuing to process one or more other data records by continuing to execute the executable logic on the one or more other data items that are associated with that value of the key.

In an aspect 27 according to any one of aspects 24 to 26, a value of the key includes a first value of the key, and wherein the method includes: saving a first state of the executable logic for the first value of the key; identifying one or more third data records associated with a second value of the key; and processing the one or more third data records in accordance with one or more logical expressions that are in relation to one or more nodes corresponding to a current state of the state machine with respect to the second value of the key.

In an aspect 28 according to any one of aspects 24 to 27, the method includes saving, in a data repository, a second state for the executable logic with respect to the second value of the key; and generating in the data repository an association between the first value of the key and the first state and the second value of the key and the second state.

In an aspect 29 according to any one of aspects 24 to 28, the one or more logical expressions correspond to one or more first portions of the executable logic that are executable when the executable logic is in a first state, the method including: following execution of the one or more first portions, updating a state of the executable logic for a first value of the key to be another state that is subsequent to the first state.

In an aspect 30 according to any one of aspects 24 to 29, the method includes based on processing a data record with one or more portions of the executable logic, publishing a data item to a queue for initiation of one or more actions.

In an aspect 31 according to any one of aspects 24 to 30, the method includes receiving data indicative of one or more edits to one or more logical expressions that are in relation to a node.

In an aspect 32 according to any one of aspects 24 to 31, the method includes receiving, from a client device, one or more logical expressions and data specifying which node is associated with the one or more logical expressions received.

In an aspect 33 according to any one of aspects 24 to 32, at least one of the nodes includes a decision node, a done node or a send node, and wherein at least another one of the nodes includes a wait node.

In an aspect 34 according to any one of aspects 24 to 33, displaying includes causing display, in one or more editor interfaces, of (i) a chart with nodes and one or more links, and (ii) one or more portions for inputting or editing one or more logical expressions in relation to one or more of the nodes.

In a general aspect 35, a data processing system for implementing a state machine, wherein the state machine is configured to process, for each value of a key, data records that are associated with that value, the data processing system including: one or more processing devices; and one or more machine-readable hardware storage devices storing instructions that are executable by the one or more processing devices to perform operations including: displaying, in one or more editor interfaces, (i) a chart with nodes and one or more links, and (ii) one or more portions for inputting or editing one or more logical expressions in relation to one or more of the nodes, wherein the one or more of the nodes correspond to a particular state of the state machine, and wherein a logical expression represents at least partial processing of a data record when the state machine is in the particular state; wherein a link between one of the nodes and another one of the nodes represents a transition of the state machine from one state to another state; transforming the one or more logical expressions and the chart into executable logic for implementing a state machine for: as data records are intermittently received, evaluating one or more fields in the data records to identify values of the key; and for each value of the key, processing one or more first data records including one or more fields on which that value of the key is based, with the processing being in accordance with one or more logical expressions that are in relation to one or more nodes corresponding to a current state of the state machine, with respect to that value of the key; and transitioning, in accordance with a link of the chart, to another state for processing one or more second data records of the intermittently received data records, wherein the one or more second data records include the one or more fields on which that value of the key is based, and wherein the one or more second data records are received after the one or more first data records.

In a general aspect 36, one or more machine-readable hardware storage devices storing instructions for implementing a state machine, wherein the state machine is configured to process, for each value of a key, data records that are associated with that value, the instructions being executable by one or more processing devices to perform operations including: displaying, in one or more editor interfaces, (i) a chart with nodes and one or more links, and (ii) one or more portions for inputting or editing one or more logical expressions in relation to one or more of the nodes, wherein the one or more of the nodes correspond to a particular state of the state machine, and wherein a logical expression represents at least partial processing of a data record when the state machine is in the particular state; wherein a link between one of the nodes and another one of the nodes represents a transition of the state machine from one state to another state; transforming the one or more logical expressions and the chart into executable logic for implementing a state machine for: as data records are intermittently received, evaluating one or more fields in the data records to identify values of the key; and for each value of the key, processing one or more first data records including one or more fields on which that value of the key is based, with the processing being in accordance with one or more logical expressions that are in relation to one or more nodes corresponding to a current state of the state machine, with respect to that value of the key; and transitioning, in accordance with a link of the chart, to another state for processing one or more second data records of the intermittently received data records, wherein the one or more second data records include the one or more fields on which that value of the key is based, and wherein the one or more second data records are received after the one or more first data records.

In a general aspect 37, a method is implemented by a data processing system to process data items of a stream of data, the processing including: receiving a specification that represents executable logic for processing data items of a stream of data, wherein the specification is associated with a key, wherein a data item is associated with a value of the key, and wherein states of the executable logic are maintained for respective values of the key; wherein the specification includes nodes and one or more links, one or more first nodes represent a first state of the executable logic, with respect to a value of the key, in which a first portion of the executable logic is executable on a first one of the data items associated with that value of key; wherein second nodes represent a second state of the executable logic, with respect to that value of the key, wherein one of the second nodes represents a portion of the executable logic that is configured to wait for a second one of the data items with that value of the key in the second state, wherein the second one of the data items is separated in time from the first one of the data items by being located after the first one of the data items in the stream, wherein another one of the second nodes represents another portion of the executable logic that is configured to cause execution of one or more actions in the second state; wherein a link between one of the one or more first nodes and one of the second nodes represents a state transition of the executable logic, with respect to that value of the key, from the first state, in which the first portion is executable, to the second state, in which the executable logic is configured to wait for the second one of the data items; and transforming the specification into executable logic for processing, for each value of the key, data items that are associated with that value and that are separated in time in a stream of data.

In an aspect 38 according to aspect 37, the method includes processing a first one of the data items by executing the first portion of the executable logic on the first one of the data items; and following execution of the first portion of the executable logic, updating a state of the executable logic.

In aspect 39 according to any one of aspects 37 to 38, the method including when in the second state, waiting for the second one of the data items by executing the portion of the executable logic for waiting for a data item satisfying one or more criteria.

In aspect 40 according to any one of aspects 37 to 39, the method including receiving the second one of the data items; and executing the other portion of the executable logic that is configured to cause execution of the one or more actions.

In a general aspect 41, a data processing system for processing data items of a stream of data, the data processing system including: one or more processing devices; and one or more machine-readable hardware storage devices storing instructions that are executable by the one or more processing devices to perform operations including: receiving a specification that represents executable logic for processing data items of a stream of data, wherein the specification is associated with a key, wherein a data item is associated with a value of the key, and wherein states of the executable logic are maintained for respective values of the key; wherein the specification includes nodes and one or more links, one or more first nodes represent a first state of the executable logic, with respect to a value of the key, in which a first portion of the executable logic is executable on a first one of the data items associated with that value of key; wherein second nodes represent a second state of the executable logic, with respect to that value of the key, wherein one of the second nodes represents a portion of the executable logic that is configured to wait for a second one of the data items with that value of the key in the second state, wherein the second one of the data items is separated in time from the first one of the data items by being located after the first one of the data items in the stream, wherein another one of the second nodes represents another portion of the executable logic that is configured to cause execution of one or more actions in the second state; wherein a link between one of the one or more first nodes and one of the second nodes represents a state transition of the executable logic, with respect to that value of the key, from the first state, in which the first portion is executable, to the second state, in which the executable logic is configured to wait for the second one of the data items; and transforming the specification into executable logic for processing, for each value of the key, data items that are associated with that value and that are separated in time in a stream of data.

In a general aspect 42, one or more machine-readable hardware storage devices storing instructions for processing data items of a stream of data, the instructions being executable by one or more processing devices to perform operations including: receiving a specification that represents executable logic for processing data items of a stream of data, wherein the specification is associated with a key, wherein a data item is associated with a value of the key, and wherein states of the executable logic are maintained for respective values of the key; wherein the specification includes nodes and one or more links, one or more first nodes represent a first state of the executable logic, with respect to a value of the key, in which a first portion of the executable logic is executable on a first one of the data items associated with that value of key; wherein second nodes represent a second state of the executable logic, with respect to that value of the key, wherein one of the second nodes represents a portion of the executable logic that is configured to wait for a second one of the data items with that value of the key in the second state, wherein the second one of the data items is separated in time from the first one of the data items by being located after the first one of the data items in the stream, wherein another one of the second nodes represents another portion of the executable logic that is configured to cause execution of one or more actions in the second state; wherein a link between one of the one or more first nodes and one of the second nodes represents a state transition of the executable logic, with respect to that value of the key, from the first state, in which the first portion is executable, to the second state, in which the executable logic is configured to wait for the second one of the data items; and transforming the specification into executable logic for processing, for each value of the key, data items that are associated with that value and that are separated in time in a stream of data.

In a general aspect 43, a method is implemented by a data processing system to process data items of a stream of data according to a specification that is associated with a key and that represents executable logic for processing the data items, wherein a data item is associated with a value of the key, wherein states of the specification are maintained for a plurality of values of the key, the processing including: accessing the specification, wherein a state of the specification represents one or more portions of the executable logic that are executable in that state; receiving a first data item of the data items, wherein the first data item is associated with a particular value of the key; identifying a first state for the particular value of the key; processing the first data item according to one or more portions of the executable logic specified by the specification as being executable in the first state; identifying a transition, with respect to the particular value of the key, from the first state of the specification to a second state in which one or more other portions of the executable logic are executable; receiving an intervening data item that is associated with another value of the key that differs from the particular value of the key and is not associated with the particular value of the key; identifying a given state of the specification associated with the other value of the key for the intervening data item; processing the intervening data item according to one or more portions of the executable logic specified by the specification as being executable in the given state; receiving a second data item of the data items that is later in the stream than the first data item and the intervening data item and that is also associated with the particular value of the key; and based on the transition of the specification with respect to the particular value of the key, processing the second data item according to one or more portions of the executable logic specified by the specification as being executable in the second state, wherein the one or more portions of the executable logic that are executable in the second state differ from the one or more portions of the executable logic that are executable in the first state.

In aspect 44 according to aspect 43, the specification includes at least a first node, a second node and a link between the first node and the second node; wherein the first node includes one or more user-configurable logical expressions; wherein the method includes transforming one or more user-configurable logical expressions of the specification into the executable logic; and executing one or more portions of the executable logic;

In aspect 45 according to any one of aspects 43 to 44, the given state for the intervening data item differs from each of the first and second states for the value of the key.

In aspect 46 according to any one of aspects 43 to 44, the given state for the intervening data item is a same state as at least one of the first state or the second state.

In aspect 47 according to any one of aspects 43 to 46, the specification includes one or more of a displayable graphical representation of the executable logic, a flowchart, a state transition diagram and a chart.

In aspect 48 according to any one of aspects 43 to 47, the method includes processing the first data item by executing, by the data processing system, one or more portions of the executable logic corresponding to one or more portions of the specification; saving a state of the executable logic reached by processing the first data item; continuing to process data items of the stream by continuing to execute the executable logic represented in the specification; and detecting the second data item of the stream that is associated with the value of the key.

In aspect 49 according to any one of aspects 43 to 48, the method includes waiting for the second data item in the stream, prior to the detecting.

In aspect 50 according to any one of aspects 43 to 49, the method includes intermittently receiving data items of the stream.

In aspect 51 according to any one of aspects 43 to 50, the method includes initiating an instance of the specification for the value of the key; and executing the instance of the specification.

In aspect 52 according to any one of aspects 43 to 51, the value of the key includes a first value of the key and the instance includes a first instance, and the method includes: identifying one or more data items of the stream associated with a second value of the key; and initiating a second instance of the specification for the second value of the key, wherein the second instance differs from the first instance.

In aspect 53 according to any one of aspects 43 to 52, the specification includes a flowchart with one or more first portions and one or more second portions; and the method includes: processing the first data item using the one or more first portions of the executable logic corresponding to the one or more first portions of the flowchart; and processing the second data item using the one or more second portions of the executable logic corresponding to the one or more second portions of the flowchart.

In aspect 54 according to any one of aspects 43 to 53, the method including based on processing the second data item, publishing a data item to a queue for initiation of one or more actions.

In aspect 55 according to any one of aspects 43 to 54, the second data item includes a data record or a data record.

In aspect 56 according to any one of aspects 43 to 55, the specification represents a rule that includes an aggregation, the method including: computing the aggregation, based on executing the rule; and saving the computed aggregation for retrieval by one or more other rules that include the aggregation.

In aspect 57 according to any one of aspects 43 to 56, the rule includes a first rule, and the method includes: accessing a second rule that differs from the first rule, wherein the second rule includes the aggregation; and executing the second rule to cause retrieval of the previously computed aggregation for use in the second rule.

In aspect 58 according to any one of aspects 43 to 57, the method including: performing an operation that saves a state of a portion of the executable logic being executed for recoverability of the state of the executable logic.

In a general aspect 59, a data processing system for processing data items of a stream of data according to a specification that is associated with a key and that represents executable logic for processing the data items, wherein a data item is associated with a value of the key, wherein states of the specification are maintained for a plurality of values of the key, the data processing system including: one or more processing devices; and one or more machine-readable hardware storage devices storing instructions that are executable by the one or more processing devices to perform operations including: accessing the specification, wherein a state of the specification represents one or more portions of the executable logic that are executable in that state; receiving a first data item of the data items, wherein the first data item is associated with a particular value of the key; identifying a first state for the particular value of the key; processing the first data item according to one or more portions of the executable logic specified by the specification as being executable in the first state; identifying a transition, with respect to the particular value of the key, from the first state of the specification to a second state in which one or more other portions of the executable logic are executable; receiving an intervening data item that is associated with another value of the key that differs from the particular value of the key and is not associated with the particular value of the key; identifying a given state of the specification associated with the other value of the key for the intervening data item; processing the intervening data item according to one or more portions of the executable logic specified by the specification as being executable in the given state; receiving a second data item of the data items that is later in the stream than the first data item and the intervening data item and that is also associated with the particular value of the key; and based on the transition of the specification with respect to the particular value of the key, processing the second data item according to one or more portions of the executable logic specified by the specification as being executable in the second state, wherein the one or more portions of the executable logic that are executable in the second state differ from the one or more portions of the executable logic that are executable in the first state.

In a general aspect 60, one or more machine-readable hardware storage devices storing instructions for processing data items of a stream of data according to a specification that is associated with a key and that represents executable logic for processing the data items, wherein a data item is associated with a value of the key, wherein states of the specification are maintained for a plurality of values of the key, the instructions being executable by one or more processing devices to perform operations including: accessing the specification, wherein a state of the specification represents one or more portions of the executable logic that are executable in that state; receiving a first data item of the data items, wherein the first data item is associated with a particular value of the key; identifying a first state for the particular value of the key; processing the first data item according to one or more portions of the executable logic specified by the specification as being executable in the first state; identifying a transition, with respect to the particular value of the key, from the first state of the specification to a second state in which one or more other portions of the executable logic are executable; receiving an intervening data item that is associated with another value of the key that differs from the particular value of the key and is not associated with the particular value of the key; identifying a given state of the specification associated with the other value of the key for the intervening data item; processing the intervening data item according to one or more portions of the executable logic specified by the specification as being executable in the given state; receiving a second data item of the data items that is later in the stream than the first data item and the intervening data item and that is also associated with the particular value of the key; and based on the transition of the specification with respect to the particular value of the key, processing the second data item according to one or more portions of the executable logic specified by the specification as being executable in the second state, wherein the one or more portions of the executable logic that are executable in the second state differ from the one or more portions of the executable logic that are executable in the first state.

In a general aspect 61, a method implemented by a data processing system for processing data items of a stream of data items according to a specification that is associated with a key, wherein a data item is associated with a value of the key, wherein states of the specification are maintained for respective values of the key, wherein the specification represents executable logic being stored in a data storage system, includes: accessing the specification that represents the executable logic, wherein a state of the specification for a particular value of the key specifies one or more portions of the executable logic that are executable in that state; receiving, over an input device or port, data items of a stream of data; for a first one of the data items of the stream, identifying a first state of the specification for a value of the key associated with that first one of the data items; processing, by the data processing system, the first one of the data items according to one or more portions of executable logic that are represented in the specification as being associated with the first state, the processing including: causing display of one or more portions of the specification; applying the one or more portions of the executable logic to the first one of the data items to obtain result data; and causing display of at least a portion of the result data with at least one of the one or more portions of the specification displayed.

DESCRIPTION OF DRAWINGS

FIGS. 11-15 are diagrams of example processes.

DETAILED DESCRIPTION

Figure 1A:
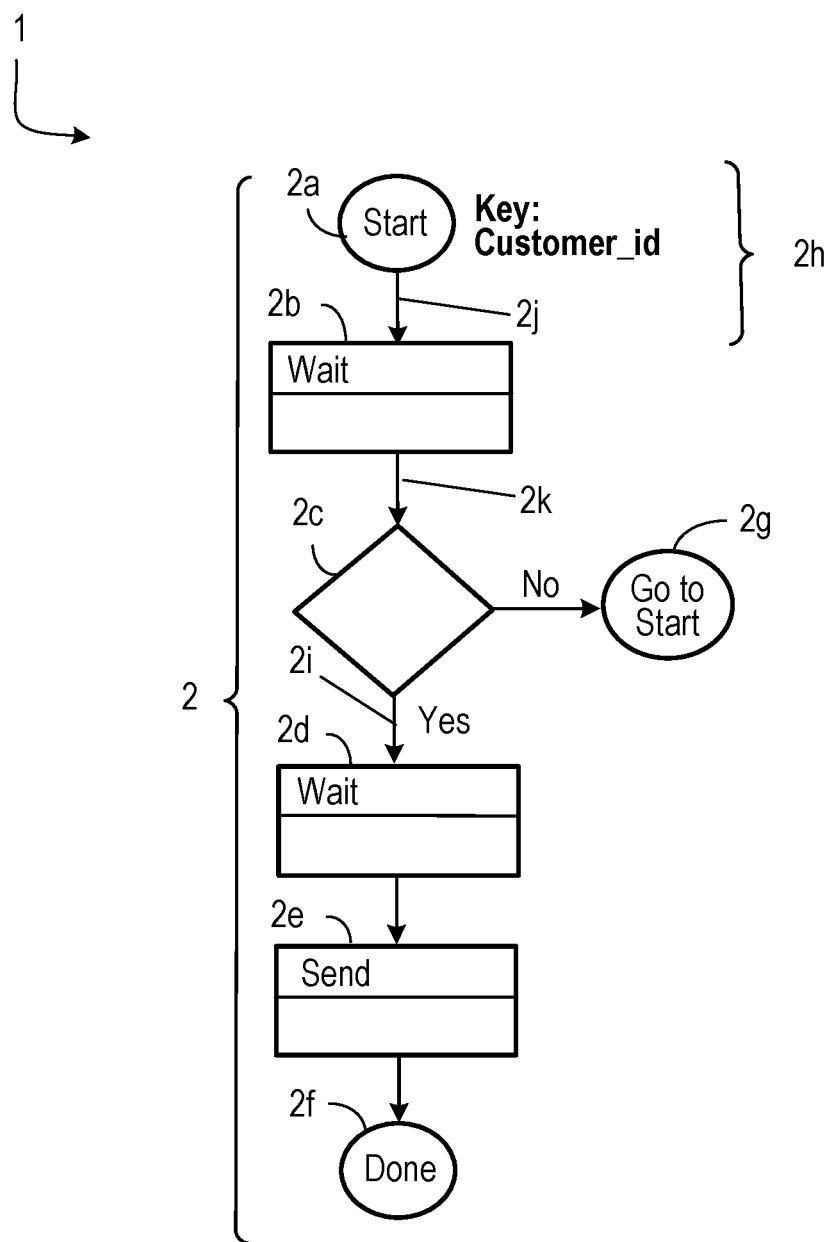
FIGS. 1A and 4 are diagrams of flowcharts.

A system consistent with this disclosure processes keyed data items that are separated in time from each other in a stream of data items, e.g., data items (including, e.g., packetized data) incoming via a network connection of a packetized network. Generally, a keyed data item includes a data item that is associated with a key (e.g., an identifier). The key can have a value. The keyed data items are processed in accordance with a specification that represents executable logic and specifies various states of the executable logic, based on a state reached from executing the executable logic on prior data items. Generally, executable logic includes source code and other computer instructions.

The specification also specifies a key. Data items associated with that key are processed in accordance with the specification. That is, based on the key, the system performs key based processing in which data items are matched up and evaluated based on respective values for the key. For each unique value of the key, the system initiates an instance of the specification for that value of the key. By doing so, data items that are separated in time from each other in the stream and that each include that value of the key are processed independent of the processing of data items including another value of the key. For example, executable logic of a specification associated with a key of the same value as the key that is associated with the data item is applied to the data item by executing the executable logic on the data item to obtain result data. Generally, an instance of the specification includes a specific realization of the specification for a unique value of a key, e.g., by executing executable logic represented in the specification and maintaining state of the executable logic for each unique value of the key. The system maintains a state for each instance, e.g., through an in-memory data grid (or other data structure), in which each value of the key is associated data indicative of a state of execution of the chart for that value of the key, as described in further detail below. Generally, an in-memory data grid may include a data structure that resides in random access memory (RAM), and is distributed among multiple servers or systems.

There are various types of keyed data items, including, e.g., an event, a record, and so forth. Generally, an event includes a data record (e.g., in a predefined format) that represents a particular occurrence or an absence thereof. While the techniques described herein are with reference to processing of data records, the techniques are also equally applicable to processing events. A data record also includes a plurality of fields. In an example, one of the field may correspond to the key for the specification. In this example, the specification specifies which one of the fields is a key field, e.g., a field that includes a value for the key of the specification. In another example, the key is based on various different data, including, e.g., values of numerous fields in a data record, data that is stored in a data repository and that is associated with a particular identifier included in a field of a data record, and so forth.

In an example, the specification represents executable logic for complex event processing (CEP) by including rules that require multiple data records (e.g., events), separated in time, as input. Generally, complex event processing includes receiving multiple data records that occur in different points in time and inferring a pattern, data record or state from the multiple data records. In this example, the specification includes a chart (e.g., a flowchart or dataflow graph) with multiple nodes. Each node in the chart represents one or more portions of the executable logic, which in turn correspond to one or more portions of a specification. For example, a node includes one or more logical expressions (hereinafter "logic") from which the executable logic is generated. In another example, a node corresponds to one or more particular portions of executable logic, when the executable logic is in a particular state.

In general, the "chart" herein described may be implemented as a dataflow graph and the methods or the processing described herein may be executed by a computing system, the computing system including: a development environment coupled to a data storage, wherein the development environment is configured to build a data processing application that is associated with the data flow graph that implements a graph-based computation performed on data items flowing from one or more input data sets through a graph of processing graph components to one or more output data sets, wherein the data flow graph is specified by data structures in the data storage, the dataflow graph having a plurality of nodes being specified by the data structures and representing the graph components connected by one or more links, the links being specified by the data structures and representing data flows between the graph components; a runtime environment coupled to the data storage and being hosted on one or more computers, the runtime environment including a pre-execution module configured to read the stored data structures specifying the dataflow graph and to allocate and configure computing resources (such as processes) for performing the computation of the graph components that are assigned to the dataflow graph by the pre-execution module, the runtime environment including an execution module to schedule and control execution of the assigned processes such that one or more of the below described operations according to the method or the processing are executed.

Referring to FIG. 1A, specification 1 includes flowchart 2 with nodes 2a-2g. Generally, a chart includes a template for processing data records. This template includes a graphic unit of logic for reacting to input data records and producing output data records, e.g., a data record generated based on logic included in a specification. Generally, a graphic unit of logic includes logic that is at least partly generated graphically, e.g., by dragging and dropping various nodes from a template (not shown) to a window for building a chart. In an example, a node includes logic (not shown) that specifies how input data records are processed, how to set values for variables used by the executable logic, which output data records to generate, e.g., upon satisfaction of conditions specified by the logic, and so forth. In an example, a node is programmable by a user inputting values of parameters and/or of variables used in the logic of a node.

The chart itself is executable, as the logic in the nodes is compiled into executable logic and as each node corresponds to one or more portions of that executable logic. For example, the system transforms the specification (and/or a chart in the specification) by compiling the logic in the nodes into executable logic. Because the chart itself is executable, the chart itself is capable of processing data records and of being stopped, started and halted. The system also maintains state for flowchart 2, e.g., by tracking which one of nodes 2a-2g is currently being executed. A state of flowchart 2 corresponds to a state of executable represented by flowchart 2. For example, each node in flowchart 2 represents a particular state of the executable logic (in which one or more portions of the executable logic are executable in that state). When flowchart 2 is being executed for numerous values of a key, the system maintains a state of flowchart 2 for each value of the key, e.g., by maintaining state for each instance—as described in further detail below. In this example, flowchart 2 includes a state transition diagram in which each incoming data record drives transitions between nodes and data records are evaluated based on a state reached from processing prior data records. The links between nodes in flowchart 2 represent the temporal flow of the logic.

Node 2a represents a start of the executable logic. Following completion of node 2a, the state of flowchart 2 transitions to node 2b, which represents one or more other portions of the executable logic. Node 2b includes a wait node (hereinafter wait node 2b). Wait node 2b represents a wait state in which a portion of executable logic (corresponding to wait node 2b) waits for an input data record satisfying one or more conditions. In an example, a wait state may be part of another state of flowchart 2, e.g., a state in which the system executes a wait node (to implement a wait state) and then executes one or more other nodes. Following completion of the portion of executable logic represented by wait node 2b, the system exits the wait state and executes node 2c, which represents executable logic for implementing a decision. In this example, node 2c includes a decision node. Generally, a decision node includes a node that includes logic for execution of a decision (e.g., logic that evaluates to a Boolean value).

Based on an outcome of the decision, the state of flowchart 2 transitions to node 2g (which causes state to transition back to node 2a) or to node 2d, which is another wait node. Following completion of the portion of executable logic represented by wait node 2d, the state of flowchart 2 transitions to node 2e, which includes a send node. Generally, a send node includes a node that represents executable logic for causing data transmission to another system. Following completion of execution of the portion of executable logic represented by node 2e, the state of flowchart 2 transitions to node 2f, which includes a done node. Generally, a done node represents that execution of the executable logic is complete.

In an example, a wait node represents a transition between states, e.g., a transition from one state to another state, the start of which is the wait node. In this example, flowchart 2 differs from a state transition diagram, because not every node in flowchart 2 represents a wait node that represents a state transition. Rather, some nodes represent actions to be performed, e.g., when flowchart 2 is already in a particular state. In some examples, the system processes flowchart 2 to generate a state machine diagram or state machine instructions.

In this example, flowchart 2 includes two states, a first state represented by nodes 2b, 2c, 2g and a second state represented by nodes 2d, 2e, 2f. In this first state, the system waits for particular data records (as represented by node 2b) and then executes node 2c, which in turn causes a transition (of specification 1 and/or of chart 2) to the second state (the start of which is represented by node 2d) or causes execution of node 2g. Once in the second state, the system again waits for particular data records (as represented by node 2d) and then executes nodes 2e, 2f. By including nodes other than wait nodes, flowchart 2 includes a logic graph of temporal processing of data records. In this example, chart 2 includes link 2i, which represents a transition of chart 2 from the first state to the second state and also represents a flow of data from node 2c to node 2d.

Chart 2 also includes link 2j between nodes 2a, 2b and link 2k between nodes 2b, 2c to represent a user-specified execution order for a portion of executable logic in the first state, which corresponds to nodes 2a, 2b, 2c. In this example, the portion of executable logic in the first state (hereinafter "first state executable logic") includes statements (e.g., logical statements, instructions, and so forth (collectively referred to herein as "statements," without limitation)). Generally, an execution order includes an order in which executable logic and/or statements are executed. Each of nodes 2a, 2b, 2c corresponds to one or more of those statements (e.g., to one or more portions of the first state executable logic). As such, link 2j represents an execution order of the first state executable logic by representing that the statements in the first state executable logic represented by node 2a are executed by the system before execution of other statements in the first state executable logic represented by node 2b. Link 2k also represents an execution order of the first state executable logic by representing that the statements in the first state executable logic represented by node 2b are executed by the system before execution of other statements in the first state executable logic represented by node 2c.

Specification 1 also includes key 2h that identifies that flowchart 2 processes data records that include key 2h or are associated with key 2h. In this example, a custom identifier (ID) is used as the key. The key 2h can correspond to one of the fields of a data record, e.g., such as a subscriber_ID field, a customer_ID field, a session_ID field and so forth. In this example, the customer_ID field is a key field. For a particular data record, the system determines a value of a key for that data record by identifying the value of the key field for that data record.

In this example, flowchart 2 subscribes to data records that are of a specified type (e.g., specified when flowchart 2 is configured). In this example, flowchart 2 subscribes to data records that include key 2h. In this example, flowchart 2 and the data records share a key. Generally, a flowchart subscribes to types of data records by including logic to process those data records that include the key of the flowchart. When data record processing begins, the system starts new flowchart instances for each new value of the key for that flowchart, e.g., by maintaining state of the executable logic (represented in the flowchart) for each new value of the key. The system performs data record processing by configuring the flowchart instances (and thus the underlying executable logic) to respond to data records for a particular key value. In an example, a flowchart subscribes to customer short message service (SMS) data records. The flowchart instance for a particular customer ID manages data records for that customer. There can be as many flowchart instances as there are customer IDs encountered in the incoming data records.

Figure 1B:
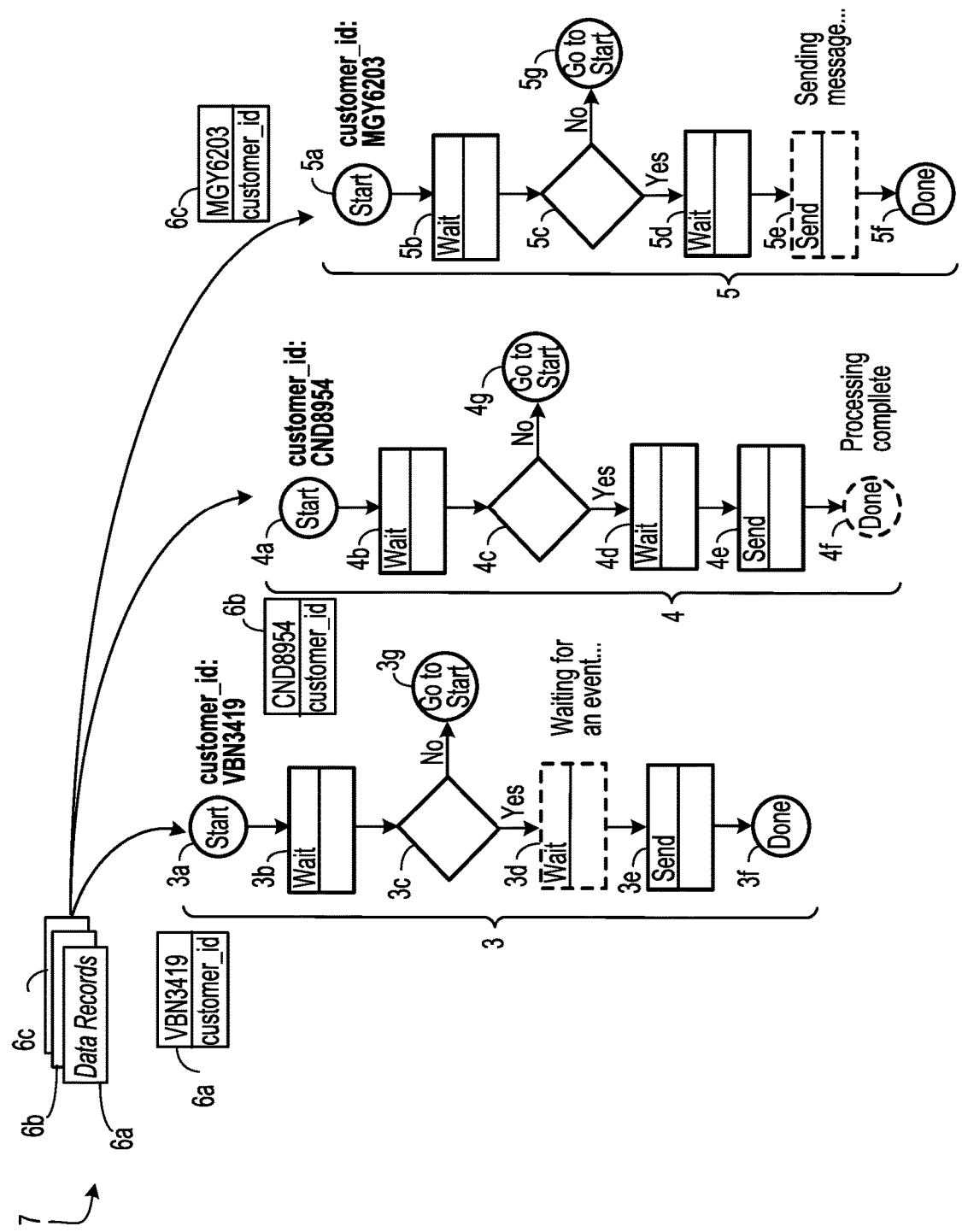
FIG. 1B is a diagram of flowchart instances.

Referring to FIG. 1B, diagram 7 illustrates flowchart instances 3, 4, 5, e.g., which are generated by the system from flowchart 2 (FIG. 1A), and data records 6a, 6b, 6c. That is, new copy or instance of flowchart 2 is created for each new key detected in data records 6a, 6b and 6c.

Each of flowchart instances 3, 4, 5 is associated with a "customer_id" key. Flowchart instance 3 processes data records that include a value of "VBN3419" in its "customer_id" field, which in this example is the key field. Flowchart instance 4 processes data records that include a value of "CND8954" in its "customer_id" field. Flowchart instance 5 processes data records that include a value of "MGY6203" in its "customer_id" field. In this example, a system does not re-execute the executable logic for each flowchart instance. Rather, the system executes the executable logic and then implements the flowchart instances by maintaining state for respective values of the keys. Accordingly, an example of "a flowchart instance processing data records" is the system executing the executable logic (that is represented by a flowchart), maintaining state for each value of a key and processing data records associated with a particular value of the key (based on a state of the state machine for that particular value of the key).

In this example, flowchart instance 3 includes nodes 3a-3g, which correspond to nodes 2a-2g in FIG. 1A, respectively. Flowchart instance 4 includes nodes 4a-4g, which correspond to nodes 2a-2g in FIG. 1A, respectively. Flowchart instance 5 includes nodes 5a-5g, which correspond to nodes 2a-2g in FIG. 1A, respectively.

Flowchart instances are themselves executable. After the system receives an input data record associated with a particular value of a key, a flowchart instance for that particular value of the key processes the input data record, e.g., by a system executing one or more portions of executable logic corresponding to a flowchart instance (or to one or more nodes of the flowchart instance). The flowchart instance continues processing the input data record, until the input data record reaches a done node or a wait node. In this example, the flowchart instance continues processing the input data record, e.g., by the system continuing to process the input data record until a portion of the executable logic corresponding to a done node or a wait node is reached. If an input data record reaches a wait node, the flowchart instance pauses until a certain amount of time passes or an appropriate new input data record arrives. Generally, an appropriate data record includes a data record that satisfies one or more specified conditions or criteria (e.g., included in the logic of a node). If an input data record reaches a done node, execution of the flowchart instance is complete.

A flowchart instance has its own lifecycle. As data records arrive, a current state or status of the flowchart instance changes: data records trigger decisions, or a return to a start of the flowchart instance, or a message sent to a customer. The flowchart instance for the customer ends when a data record reaches a done node.

In this example, the system starts flowchart instance 3 for a "VBN3419" value of the key field (e.g., customer_id=VBN3419). Flowchart instance 3 processes a subset of data records 6a, 6b, 6c that include a customer_id of VBN3419. In this example, flowchart instance 3 processes data record 6a, with a value of "VBN3419" in the customer_id key field. Nodes 3a, 3b, 3c of flowchart instance 3 process data record 6a. A current state of flowchart instance 3 is that of waiting for a data record, as represented by the dashed line of node 3*d*. Upon reaching node 3*d*, flowchart instance 3 waits for another data record with customer ID=VBN3419 to process through nodes 3*d*, 3*e*, 3*f* of flowchart instance 3.

The system starts flowchart instance 4 for a "CND8954" value of the key (e.g., customer_id=CND8954). Flowchart instance 4 processes a subset of data records 6*a*, 6*b*, 6*c* that include a customer_id of CND8954. In this example, flowchart instance 4 includes wait nodes 4*b* and 4*d*. Each data record can only satisfy the condition of one wait node per flowchart instance. Accordingly, flowchart instance 4 processes data record 6*b* with a customer_id=CND8954 through node 4*b* to node 4*d* and then waits for a second data record with the same key before proceeding to node 4*f*. The system starts flowchart instance 5 for a "MGY6203" value of the key (e.g., customer ID=MGY6203). Flowchart instance 5 processes a subset of data records 6*a*, 6*b*, 6*c* that include a customer_id of MGY6203. In this example, flowchart instance 5 processes data record 6*c* with a customer_id=MGY6203 through nodes 5*b*-5*d* and then waits for a second data record with the same key before proceeding to node 5*e*, in which a message is sent. In this example, the system does not stop at a non-wait node and thus does not stop at node 5*e*, but rather sends the message and then proceeds to node 5*f*.

In a variation of FIG. 1B, the system generates more than one flowchart instance for a single key value. For example, there can be a number of flowchart instances for the same customer that have different start and end dates, or a number of flowchart instances for the same customer for different marketing campaigns.

In this example, the system maintains states for the instances by storing, in a data repository or in an in-memory data grid, state data, e.g., data indicative of which node is currently being executed for each instance. Generally, state data includes data indicative of a state. In this example, an instance is associated with value of the key. The data repository or the in-memory data grid stores the values of the key. The system maintains state for the instances by storing state data for each value of the key. Upon completion of processing a data record for a particular value of the key, the system updates the state data, in the data repository, to specify that the next node (in flowchart 2) represents a current state for that value of the key. Then, when another data record arrives, the system looks-up, in the data repository, the current state for that value of the key and executes portions of executable logic corresponding to a node that represents the current state of the executable logic for that value of the key.

Figure 2:
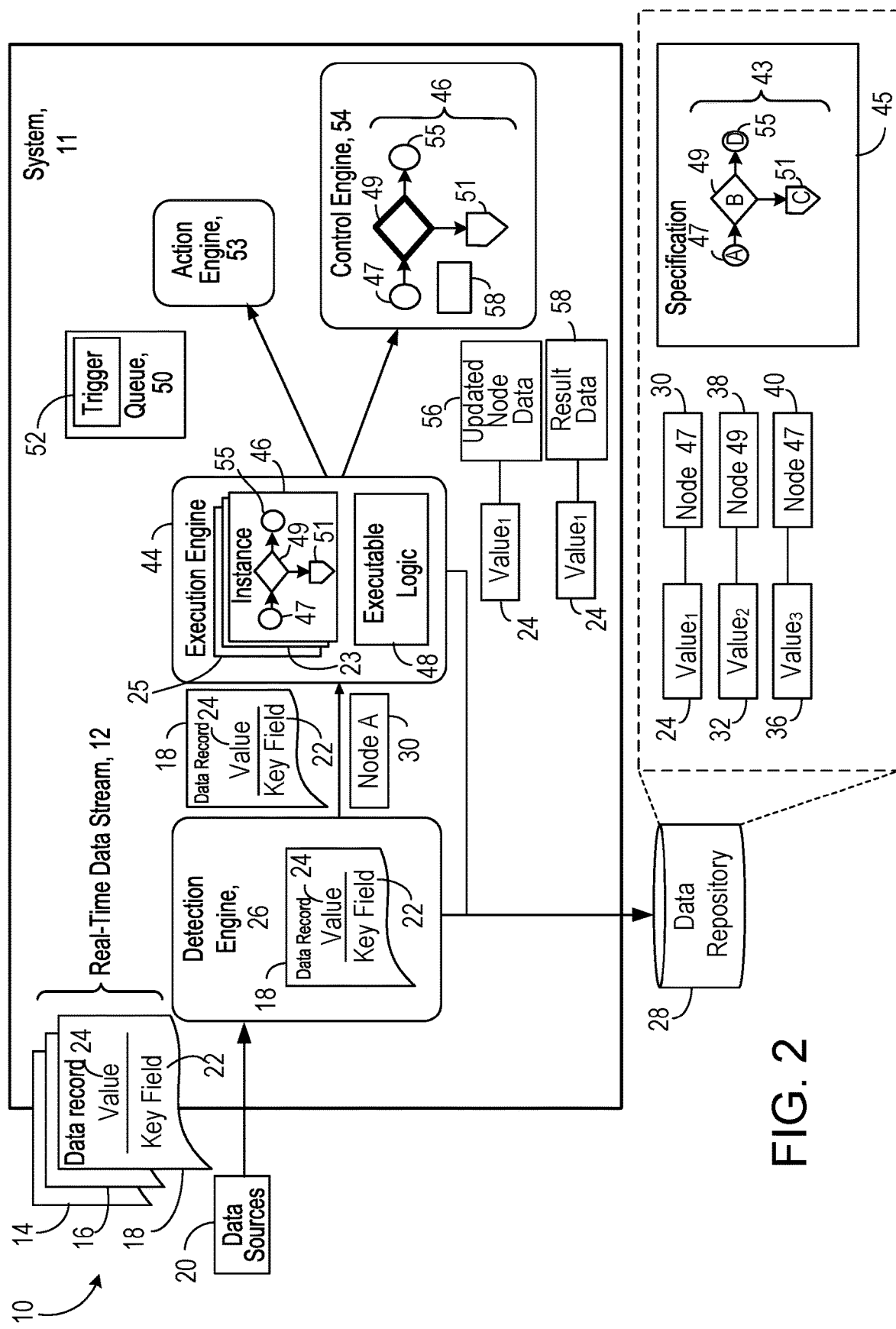
FIGS. 2 and 3 are diagrams of systems for processing keyed data.

Referring to FIG. 2, networked environment 10 includes an environment for processing keyed data records, based on a state reached from processing prior, keyed data records. Networked environment 10 includes system 11 for processing the data records and data sources 20 from which the data records are received. One or more of the data records may be a part of a data item so that the received one or more data records are received in the form of one or more data items. In this example, data sources 20 transmit (over one or more networks (not shown)) data records 14, 16, 18 of real-time data stream 12 to system 11. As such, system 11 intermittently receives one or more of data records 14, 16, 18 or other data records (not shown). Each of data records 14, 16, 18 may be separated in time from each other, such that, e.g., data record 14 arrives first at system 11, data record 16 arrives next at system 11 (e.g., by being located in real-time data stream 12 after data record 14) and data record 18 arrives next at system 11 (e.g., by being located in real-time data stream 12 after data record 16, which in turn is located in real-time data stream 12 before data record 18 and after data record 14). Each of data records 14, 16, 18 includes one or more fields (e.g., a field for a customer ID, a field for an account ID, and so forth). In this example, data record 18 includes key field 22 with value 24.

System 11 includes detection engine 26 for detecting data records and data records, execution engine 44 for executing executable logic 48 against one or more data records and data records, action engine 53 for initiating one or more actions based on results of executing executable logic 48 on the data records and data records and control engine 54 for run-time monitoring and control. Executable logic 48 is stored in a data storage system, e.g., such as system 11. In this example, data repository 28 includes specification 45 that represents executable logic 48, one or more states of executable logic 48 and transitions among states of executable logic 48.

Specification 45 includes a displayable graphical representation of executable logic 48. There are various types of displayable graphical representations, including, e.g., a chart, a flowchart, and so forth. In this example, specification 45 includes chart 43 with nodes 47, 49, 51, 55. A node represents a particular portion of executable logic 48 that is executable when that portion of executable logic 48 is in a particular state specified by specification 45. Accordingly, chart 43 provides a template for execution of executable logic 48. In this example, system 11 compiles the logic in chart 43 of specification 45 into executable logic 48, execution of which causes system 11 to react to input data records and to produce output data records.

Specification 45 also specifies a key (not shown) for chart 43. In this example, key field 22 corresponds to the key for chart 43. For each value of the key field, execution engine 44 process data records or data items for that value of the key field independent of data records for other values of the key field. To do so, execution engine 44 initiates an instance of chart 43 for each unique value (of key field 22) included in data records of real-time data stream 12. In this example, execution engine 44 initiates instances 23, 25, 46 for values of the key included data records 14, 16, 18, respectively. For each instance of chart 43, system 11 maintains a state of the executable logic for that instance by tracking a current position of the node in that instance being executed. A current position specifies which node in a chart is currently being executed. System 11 executes a node by executing one or more portions of executable logic represented by that node. Generally, the current position represents a current state of the executable logic. In an example, a current position between data records only is a wait node, as the system only stops at wait nodes and does not stop at non-wait nodes. In this example, other current positions are transient since when a data record comes in, the system runs all nodes in sequence in a chart up to the next wait node (or done node) and then remembers that current position by storing data indicative of that current position.

System 11 tracks a current position for each instances 23, 25, 46 of chart 43 by storing in data repository 28 node data items 30, 38, 40 in association with values 24, 32, 36, respectively. A node data item specifies which node (in an instance of specification 45) is currently being executed, e.g., thereby specifying a state of an instance of a chart and a state of the executable logic. Each of values 24, 32, 36 corresponds to a unique value of key field 22. Accordingly, an association between a value and a node data item specifies a current position of an instance of chart 43 initiated for that value. In this example, instance 46 is initiated for value 24 included in data record 18.

Data record 16 includes value 32 of key field 22. Instance 23 is initiated for value 32. Value 24 is associated, in data repository 28, with node data item 30 to specify that the current position of instance 46 is node 47. Value 32 is associated, in data repository 28, with node data item 38 to specify that the current position of instance 23 is node 49. In this example, data record 14 includes value 36 of key field 22. Instance 25 is initiated for value 36. Value 36 is associated, in data repository 28, with node data item 40 to specify that the current position of instance 25 is node 47.

In this example, system 11 receives, over an input device or port (not shown), data record 18 from one or more of data sources 20. Detection engine 26 of system 11 analyzes data record 18 to determine that data record 18 is associated with value 24 of key field 22. Detection engine 26 looks-up in data repository 28 (or in an in-memory data grid—not shown) a state of the specification for value 24 of key field 22. In this example, value 24 is associated with node data item 30 to specify that node 47 is the current position for instance 46 of specification 45. Thus, a state of specification 45 for value 24 of key field 22 is node 47. Detection engine 26 transmits, to execution engine 44, data record 18 and node data item 30. Based on node data item 30, execution engine 44 identifies that a current position for instance 46 of specification 45 is node 47. In this example, a particular portion of executable logic 48 corresponds to node 47. Execution engine 44 processes data record 18 by executing the particular portion of executable logic 48 on (or with regard to) data record 18 (e.g., applying the particular portion of executable logic 48 to data record 18).

Based on execution of one or more portions of executable logic 48 on data record 18, execution engine 44 generates trigger 52. Generally, a trigger includes an output data record. For example, a trigger include a data record that causes a SMS message to be sent to a customer. To do so, execution engine 44 generates an output data record with the details of the message to be sent and action engine 53 causes the output data record to be turned into an SMS message. In this example, trigger 52 is published to queue 50 for processing and execution by action engine 53.

Based on processing of data record 18, execution engine 44 also updates the current position for instance 46 of chart 43 to be node 49. Execution engine 44 does so by generating updated node data 56, which specifies a current position of instance 46. Based on updated node data 56, execution engine 44 transmits instructions to data repository 28 to update node data item 30 with contents specifying that the current position in instance 46 is node 49. Execution engine 44 also generates result data 58 indicative of a result of executing on data record 18 one or more portions of executable logic 48 represented by node 47. Execution engine 44 transmits, to control engine 54, updated node data 56 (in association with value 24) and result data 58 (also in association with value 24).

In this example, control engine 54 generates data for displaying instance 46 of chart 43 for testing and real-time monitoring of data records including value 24 of key field 22. In this example, node 49 is visually highlighted to indicate that node 49 represents the current position of instance 46. Control engine 54 also generates data for displaying result data 58 with instance 46. Result data 58 may be overlaid on one or more portions of instance 46. In another example, the data generated by control engine 54 is for displaying result data 58 with (e.g., in juxtaposition to or in proximity to) node 47. In this example, control engine 54 generates result data for each node of flowchart 43 (and/or for each instance of flowchart 43) and displays the result data in juxtaposition to that node in flowchart 43 (and/or in each instance of flowchart 43), when flowchart 43 (and/or each instance of flowchart 43) is displayed. In this example, the result data is indicative of a number of data records processed through each node. In another example, the result data is indicative of which individual data records are processed by a particular node, e.g., when data records are processed for a particular value of a key field.

Following processing of data record 18, execution engine 44 may wait for one or more subsequent data records that also include value 24 for key field 22. As execution engine 44 processes each data record for value 24, executable logic 48 transitions among states as defined by specification 45. These subsequent data records are processed in accordance with one or more portions of executable logic 48 as specified by specification 45.

In a variation, system 11 determines a value of the key for chart 43 based on one or more values in one or more data record fields of received data records, e.g., rather than the value of the key corresponding to a value of a particular data record field—a key field. In this example, system 11 receives (or is configured with) instructions specifying which of one or more data record fields are used in a value of the key. In another example, system 11 receives a data record and parses the data record for values of those specified fields. Based on the values of those specified fields, system 11 determines or generates a value for the key, e.g., by augmenting the values of those specified fields, by modifying the values of those specified fields, by querying a data repository for another value that is associated with one or more of the values of those specified fields, and so forth.

In an example, the key for a chart is a customer account ID. In this example, data repository 28 stores customer account IDs for customers in association with other data, such as customer IDs. In this example, data records do not include a data record field for customer account IDs. Rather, data records include a data record field for a customer ID ("customer ID data record field"). In this example, system 11 executes instructions to determine the customer account ID based on the customer ID data record field. System 11 parses the data record for a value of the customer ID data record field. System 11 uses that parsed value to query data repository 28 for a customer account ID associated with that parsed value. In response, data repository 28 returns a value for a customer account ID (that is associated with the parsed value). System 11 sets the value of the key to be the value for the customer account ID.

In another example, the key for a chart includes values from multiple data record fields. In this example, system 11 concatenates these values together to produce a value of the key. In still another example, the key for a chart includes values from one or more data record fields concatenated with other data stored in data repository, e.g., such as customer account data, customer profile data, customer purchase data, and so forth. In yet another example, a value of a key (e.g., as stored in data repository 28) includes a predefined number of bits. In this example, the value of the key is based on a value of a specified data record field. The data record field holds a number of bits that differs from the number of bits required for the key. In this example, system 11 generates a value for the key by inserting (or deleting) a predefined number of bits before or after the value of the specified data record field. Using this generated value of the key, system 11 identifies in data repository 28 state data (e.g., a node data item) that is associated with a value (for the key) corresponding to the generated value of the key.

Figure 3:
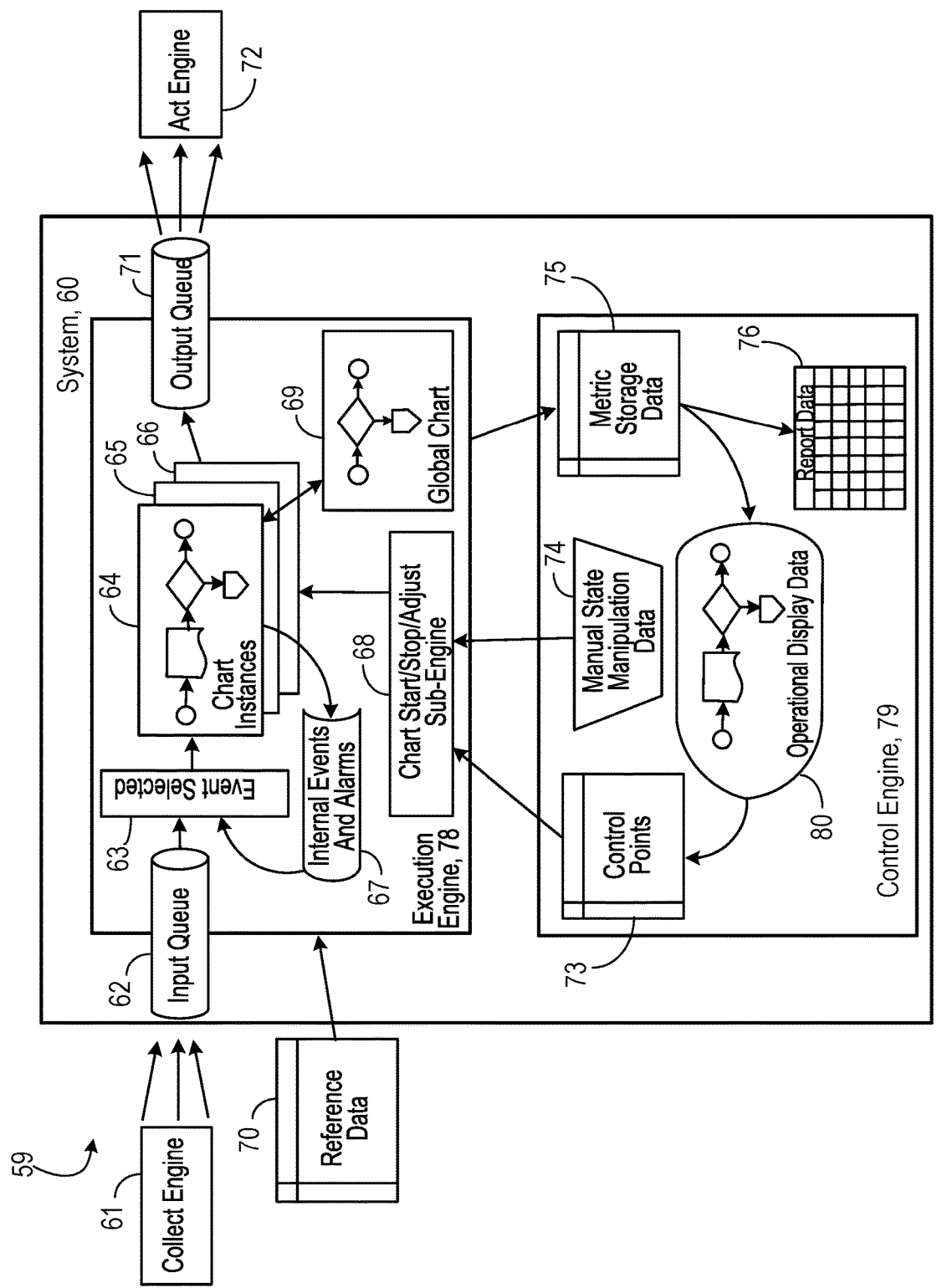

Referring to FIG. 3, environment 59 includes system 60 for implementing a CEP rules environment (CRE). In an example, system 60 includes or is included in system 11 (FIG. 2). In an example, system 60 is the same system as system 11. In another example, system 60 differs from system 11. In this example, system 60 includes a CRE system.

Environment 59 includes collect engine 61 for collecting one or more data records (not shown), e.g., from an external resource. Environment 59 also includes act engine 72 for initiating or performing one or more actions specified by one or more output data records of system 60. In an example, system 60, collect engine 61 and act engine 72 are included in another system e.g., a parent system. In another example, collect engine 61 and act engine 72 are each included in and implemented by systems that differ from system 60. In still another example, one or more of collect engine 61 and act engine 72 are included in system 60.

In this example, collect engine 61 transmits one or more data records (not shown) to input data record queue 62. Generally, an input data record queue is a queue for receiving input data records. Generally, an input data record is a data record that represents a particular occurrence that has happened external to system 60, collect engine 61 and act engine 72. In an example, an input data record includes data specifying that a customer made a telephone call or sent a transaction. In another example, an input data record includes data specifying an occurrence of a monetary transaction. In this example, for each data record received by collect engine 61, collect engine 61 publishes that data record to input data record queue 62 for processing by execution engine 78. By doing so, system 60 processes data records independent of database queries and lookups with regard to the data records themselves. This publication of data records to a queue decreases a latency associated with data record processing, relative to a latency associated with data record processing when data records are stored in data repository and then system 60 performs a database query or lookup to retrieve the data record.

Input data record queue 62 transmits one or more data records to execution engine 78. In this example, execution engine 78 selects data record 63 received from input data record queue 62. In this example, execution engine 78 executes instances 64, 65, 66 of a chart (not shown). Hereinafter, instances 64, 65, 66 are referred to as chart instances 64, 65, 66, without limitation and for purposes of convenience. Each of chart instances 64, 65, 66 corresponds to a unique value (of a key) of data records included in input data record queue 62.

In this example, execution engine 78 selects one of chart instances 64, 65, 66 that is initiated for a value of the key included in data record 63. Execution engine 78 processes data record 63 in accordance with the selected one of chart instances 64, 65, 66 using the techniques described herein. Execution engine 78 includes internal data records and alarms 67. Generally, an internal data record includes a data record that is sent from one chart to another. For example, a chart (or a chart instance) may generate an internal data record, which is not sent to act engine 72, but instead is sent into another chart (or chart instance). In an example, each chart represents a thread in a threaded process. In this example, an internal data record represents a way in which to send data between threads. Generally, an alarm includes a predefined type of data record (e.g., that a chart sends itself) that arrives at a pre-calculated time in the future. The system generates alarms to execute wait states. For example, a chart (or chart instance) may be configured to wait for a period of time, which is implemented as an alarm that is saved in an internal data structure and presented to the chart at a later time.

Based on execution of one or more of chart instances 64, 65, 66, execution engine 78 generates one or more output data records and publishes these output data records to output data record queue 71, e.g., a queue for holding output data records. System 60 transmits to act engine 72 the output data records included in output data record queue 71. Once act engine 72 receives an output data record, act engine 72 performs one or more actions or generates one or more actions for performance in accordance with content of the output data record.

Execution engine 78 includes global chart 69. Generally, a global chart includes a chart for which there is one instance. Global charts are used to manipulate global variables (e.g., a variable indicative of a number of different accounts seen in data records received in a real-time data stream). Generally, charts may run in the context of a key, but there are some charts that run exactly one instance, i.e., global charts. Global charts are used internally in execution engine 78, e.g., as a request/response synchronous service. Generally, a request/response synchronous service includes a service that provides an immediate response to a request.

Execution engine 78 includes chart sub-engine 68 for starting, stopping or adjusting charts (and/or chart instances), e.g., based on one or more instructions received from a user and/or based on manual state manipulation data 74, as described in further detail below. In an example, execution engine 78 also retrieves reference data 70 from one or more data repositories, e.g., data repositories that are external to environment 59 or that are included in environment 59. Generally, reference data includes data associated with a particular key or a particular value of the key. For example, a customer account is a key. In this example, the reference data includes account details for the customer account.

System 60 also includes control engine 79 for run-time monitoring (and/or testing) and control of chart instances and charts. In this example, control engine 79 represents the run-time environment of system 60. Data indicative of activity within execution engine 78 is traced and sent to the control engine 79 for run-time monitoring and/or testing. This traced data is stored in a database (not shown) or in a dataset, e.g., such as metric storage data 75 (which is stored in stored in a database). Control engine 79 generates operational display data 80 for rendering, on a display device, a real-time visualization of execution of a chart instance and showing current statistics of running execution engine 78. Control engine 79 uses this traced data to generate report data 76, including, e.g., various tabular reports that summarize the behavior of chart instances 64, 65, 66.

Control engine 79 also controls the running of the charts and/or one or more of chart instances 64, 65, 66, e.g., by providing a user with controls (or data for controls) that stop, start or halt charts and their instances. Selection of one or more of these controls causes control engine 79 to generate manual state manipulation data 74. Generally, manual state manipulation data 74 includes data for manually manipulating (e.g., changing) a state of a chart instance. For example, a state of a chart instance may be manually changed by restarting the chart, pausing the chart or stopping the chart. In another example, a user is able to select a chart for a subset of keys (e.g., by specifying the current state of that chart) and then change the state of the chart for those keys. In this example, control engine 79 transmits manual state manipulation data 74 to chart sub-engine 68 for controlling the chart in accordance with the state manipulation data 74. Chart sub-engine 68 processes manual state manipulation data 74 as instructions specifying how to manipulate a state of a running chart instance.

Control engine 79 also includes control points 73. Generally, a control point includes a run-time parameter that is defined by a user (generating a chart) and is used to change the behavior of one or more charts (or chart instance) at run-time. Execution engine 78 reads a control point as a read-only variable and also as a global variable. In an example, control points 73 are defined in a user interface for defining and configuring a chart and are exposed through a run-time interface (e.g., generated from operational display data 80). Because execution engine 78 reads control points 73 as global variables, one or more of control points 73 can be changed while a chart is running to change the behavior of that chart. For example, using control points, individual charts can be started or stopped, thresholds can be changed, optional logic can be enabled or disabled, and so forth. Based on control points, this real-time configuration is performed without stopping charts.

In this example, system 60 is also configured for recoverability, e.g., by performing one or more operations that save a state of a portion of the executable logic being executed for recoverability of the state of the executable logic. For example, at least some of the nodes of a chart include logic that causes system 60 to perform a checkpoint operation that saves in a buffer (e.g., of system 60) a state of the executable logic (e.g., by saving data indicative of a current position in the flowchart) to enable recoverability of a state of the executable logic.

Figure 4:
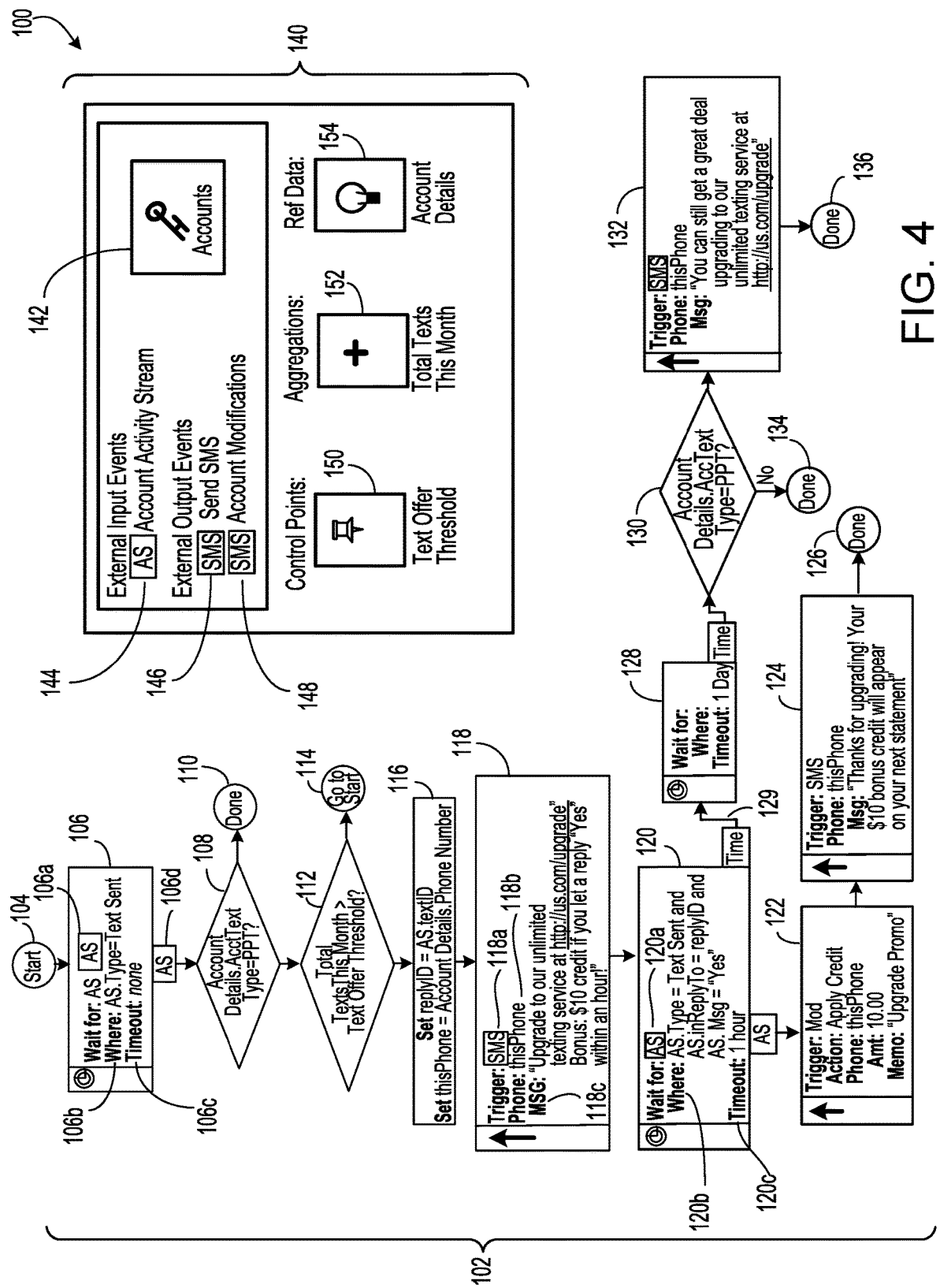

Referring to FIG. 4, specification 100 includes chart 102. Generally, chart 102 represents logic for the following scenario: when a customer sends a text message, if that customer is still using a "Pay-per-Text" plan, but that customer has sent enough text messages in a current month to make an unlimited texting plan attractive, then the system will send an SMS message to the customer suggesting that the customer upgrades to the unlimited plan. In addition, when the system sends the offer, the customer is also credited with a bonus $10 credit, if the customer upgrades by replying to the SMS message within an hour. Otherwise, the customer is instructed to upgrade on the web.

In this example, chart 102 includes nodes 104-136 for implementing the above-described logic. The system maintains a current position for chart 102. As previously described, the current position specifies which node is currently being executed. In this example, the system executes a node by executing one or more portions of executable logic represented by that node. The system maintains a state of the executable logic and of chart 102 by maintaining the current position data for chart 102.

Start node 104 specifies an entry into chart 102 and a starting place of the logic. Following completion of one or more portions of executable logic represented by start node 104, the system updates the current position of chart 102 to be wait node 106. In this example, wait node 106 includes portions 106a, 106b, 106c and 106d. Each of portions 106a, 106b, 106c is editable for a user to enter or to modify various logic used by wait node 106. The logic included in portions 106, 106b, 106c is compiled by the system into executable logic. Portion 106a specifies the name or type of data record for which the portion of executable logic (represented by wait node 106) waits. In this example, "AS" represents an account activity stream data record. Portion 106b specifies a condition that must be satisfied once a data record of the appropriate type is received. Portion 106c may specify a timeout, e.g., an amount of time for which the system waits for the specified type of data record. In this example, wait node 106 does not include a timeout.

In accordance with chart 102, the AS data record, once received, is processed in accordance with the logic of the next node (i.e., decision node 108), as specified by the data record abbreviation 106d at the bottom of wait node 106.

Chart 102 specifies that based on result of processing the AS data record in accordance with the logic of decision node 108 that the executable logic transitions to a state in which the executable logic is done processing data records, as represented by done node 110, or transitions to another state in which further evaluation of the AS data record is performed, as represented by decision node 112. Based on processing of the AS data record in accordance with the logic of decision node 112, the executable logic either transitions to a state in which it returns to a starting state of the executable logic, as specified by node 114, or transitions to a state in which a value of a chart instance variable is set, as specified by node 116. Generally, a chart instance variable includes a variable that has one value for each instance of the chart.

Following setting of the value of the chart instance, the system updates the current position of chart 102 to be trigger node 118, representing a state of the executable logic in which an output data record is sent to a portion of the system for acting on output data record. When programming chart 102 with logic for sending an output data record, a user has to identify which output data record type is being sent and populate fields 118a, 118b, 118c of trigger node 118 for that type of data record. In this example, the user wants to send an output data record of a SMS type. To do so, the user selects a value of "SMS" for field 118a. The value of fields 118b, 118c are also supplied by a user. In this example, field 118b specifies a phone number to use when sending the SMS message and field 118c specifies contents of the message to send.

Following completion of trigger node 118, the system updates the current position of chart 102 to be wait node 120, representing a state in which the executable logic waits for one or more additional data records (e.g., that are separated in time from one or more data records that were previously being waited for in accordance with wait node 106.)

In this example, wait node 120 includes portions 120a, 120b, 120c. Portion 120a specifies the name or type of data record for which the portion of executable represented by wait node 120 waits. In this example, wait node 120 represents waiting for an AS data record. Portion 120b specifies a condition that must be satisfied once an AS data record is received and displays one or more logical expressions (or a visualization that is based on logical expressions). Portion 120c specifies a timeout, e.g., an amount of time for which the system waits for the specified type of data record. If no appropriate data record is received during the amount of time specified by portion 120c, then the wait will timeout, and a current position of chart 102 moves to wait node 128 connected to timeout arrow 129 leaving wait block 120. In this example, wait node 128 represents executable logic to wait a day and then transition to a state represented by decision node 130. Based on a result of evaluation of account details in accordance with the logic of decision node 130, the current position of chart 102 is updated to be either done node 134, representing a state in which execution is complete, or trigger node 132, representing a state of performing a trigger of sending an SMS message. Following completion of the trigger specified by trigger node 132, the system updates the current position to be done node 136, representing a state in which execution is complete.

If another AS data record is received within the time specified by portion 120c, the current position of chart 102 is updated to be trigger node 122 and the executable logic transitions to a state represented by trigger node 122, in which a credit is applied to the user's account. Following completion of the trigger specified by trigger node 122, the current position of chart 102 is updated to be trigger node 124 and the executable logic transitions to a state represented by trigger node 124 for sending a thank you SMS to a customer. Following completion of the trigger specified by trigger node 124, the current position of chart 102 is updated to be node 126 resenting a state of the executable logic in which execution is completed.

Specification 100 also includes legend portion 140. In this example, legend portion 140 includes key portion 142 that specifies a key for specification 100 and for chart 102. In this example, a customer account ID is the key. For each unique value of the key (e.g., each unique value of a customer account ID), the system generates an instance of chart 102, thereby generating one instance of chart 102 for each customer. In this example, the system maintains a current position for every running chart instance. As such, the system associates each customer with an instance of chart 102 and maintains state for each of these instances, e.g., by tracking a current position for each instance.

Legend portion 140 also includes external input data records portion 144, which specifies types of data records that are input data records processed by the logic of chart 102. Generally, an external input data record is a data record received from an external source that is an input to executable logic represented by a chart. In this example, external input data records portion 144 specifies that account activity stream data records are the external input data records. Legend portion also includes external output data records portion 146, 148 specifying which types of data records are generated from and output by the logic of chart 102. In this example, external output data records portion 146, 148 specifies that there are SMS and account modifications output data records, respectively.

Legend portion 140 includes control point portion 150 indicative of a control point. Execution of executable logic represented by chart 102 does not have to be stopped to read-in new values for control points. In this example, decision node 112 includes logic that is based on a control point represented by control point portion 150. The control point represented by control point portion 150 includes a numeric value called Text Offer Threshold, which is included in the logic of decision node 112. This control point includes the number of text messages which a customer has to send before being given the offer. The number of text messages which a customer has to send before being given the offer is stored in a control point to allow a threshold (e.g., the Text Offer Threshold) to be changed without changing or restarting chart 102.

Legend portion 140 includes aggregations portion 152 indicative of aggregations. An aggregation includes a value that is computed by combining together values from multiple data records over time. Aggregations are associated with a key. In some example, the key for the chart will match the key of the aggregation. The particular aggregation referenced by aggregations portion 152 is called Total Texts This Month. There is a different value of this aggregation for each account (i.e., each value of the key), and the aggregation is automatically incremented whenever a text message is send for the corresponding account. Aggregations are discussed in further detail below.

Legend portion 140 also includes reference portion 154 that represents reference data. Generally, reference data includes data that is external to chart 102 and/or to executable logic represented by chart 102 and is accessed by a lookup operation. Reference data is associated with a key, which may be the same key as the chart. Some reference data is global and either needs no key, or is referenced by explicitly supplying a key (e.g., a zip code to state lookup).

Figure 5:
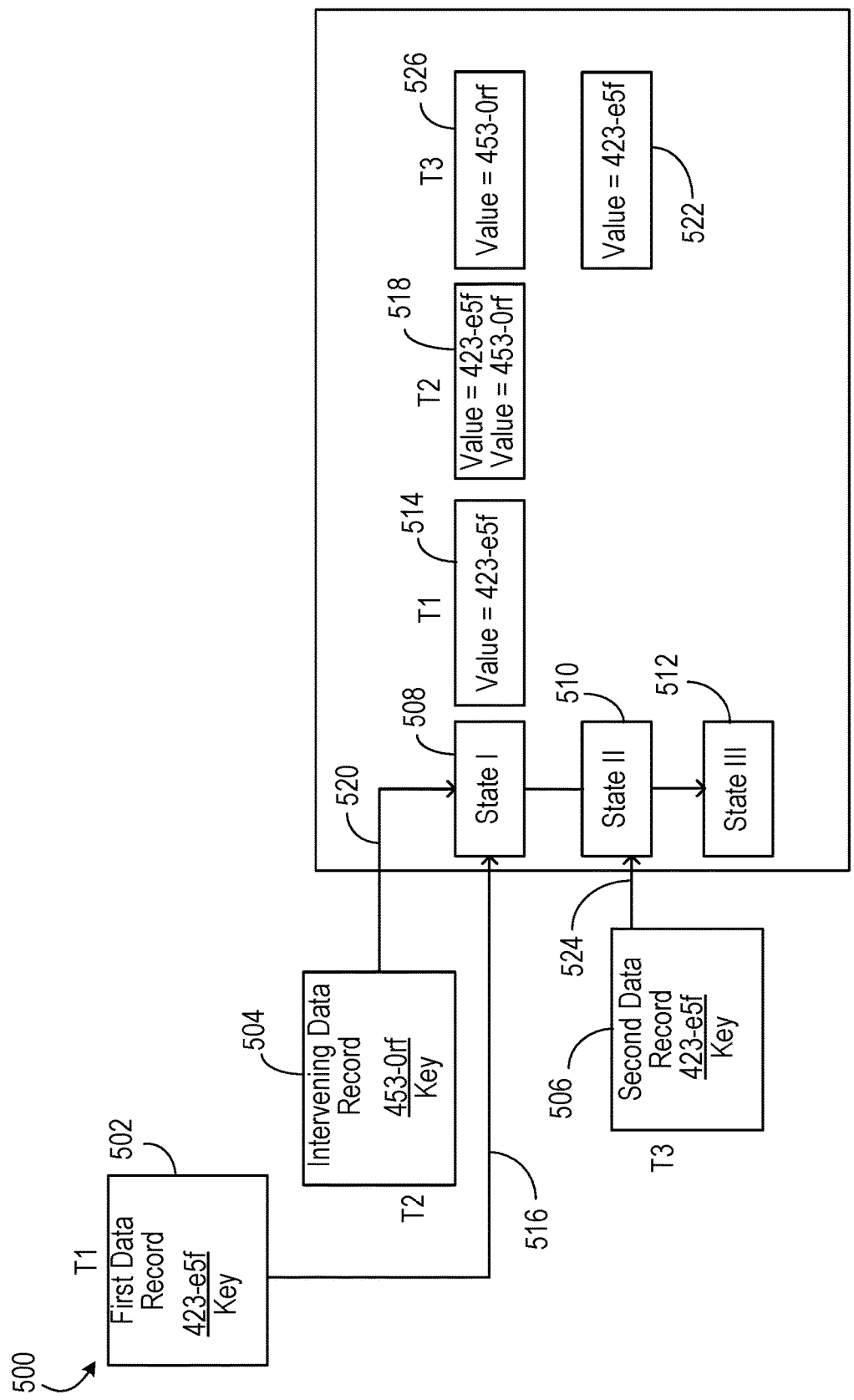
FIG. 5 is a diagram processing keyed data records.

Referring to FIG. 5, diagram 500 illustrates states 508, 510, 512 of executable logic over times T1, T2, T3. The executable logic is represented by chart 102 (FIG. 4). In this example, a state of the executable logic is maintained for each value of the key for chart 102. The executable logic includes states 508, 510, 512, the start of which is represented by wait nodes 106, 120, 128 (in FIG. 4), respectively. In this example, each of states 508, 510, 512 includes a wait state. The system maintains a state of the executable logic for each instance of chart 102, e.g., by maintaining state for each unique value of the key.

In this example, the system receives data record 502 at a first time, T1. Data record 502 is associated with a "423-e5f" value for the key. The system processes data record 502 in accordance with a chart instance for that value of the key. Upon reaching wait node 106 (FIG. 4), the system updates a current state of the chart instance associated with the "423-e5f" value to be state 508. In this example, the system generates an association (e.g., in a data repository) between data indicative of state 508 and data 514 representing a value of the key equal to 423-e5f Through this association, the system specifies that, at time T1, a current state of the chart instance for value=423-e5f is state 508. In this example, link 516 visually indicates that data record 502 is associated with state 508. In this example, the specification specifies one or more portions of the executable logic that are executable when the executable logic is in state 508. For example, the specification includes a node that corresponds to the one or more portions of the executable logic that are executable when the executable logic is in state 508.

The system receives data record 504 at a second time, T2. Data record 504 is an intervening data record that is received by the system after data record 502 and before data record 506. Data record 504 is associated with a "453-0rf" value for the key. The system processes data record 504 in accordance with a chart instance for that value of the key. Upon reaching wait node 106 (FIG. 4), the system updates a current state of the chart instance associated with the "453-0rf" value to be state 508. In this example, the system generates an association (e.g., in a data repository) between data indicative of state 508 and data 518 representing a value of the key equal to 423-e5f and another value of the key equal to 453-0rf. Through this association, the system specifies that, at time T2, a current state of each of the chart instances for value=423-e5f and value=453-0rf is state 508. In this example, link 520 visually indicates that data record 504 is associated with state 508.

The system receives data record 506 at a third time, T3. Data record 506 is associated with the "423-e5f" value for the key. The system processes data record 506 in accordance with the chart instance for that value of the key. Upon reaching wait node 120 (FIG. 4), the system updates a current state of the chart instance associated with the "423-e5f" value to be state 510. In this example, the system generates an association (e.g., in a data repository) between data indicative of state 510 and data 522 representing a value of the key equal to 423-e5f Through this association, the system specifies that, at time T3, a current state of the chart instance for value=423-e5f is state 510. In this example, link 524 visually indicates that data record 506 is associated with state 510. The system also generates an association between data representing state 508 and data 526, representing that at time T3 only the chart instance with a value=453-0rf is in state 508.

Figure 6:
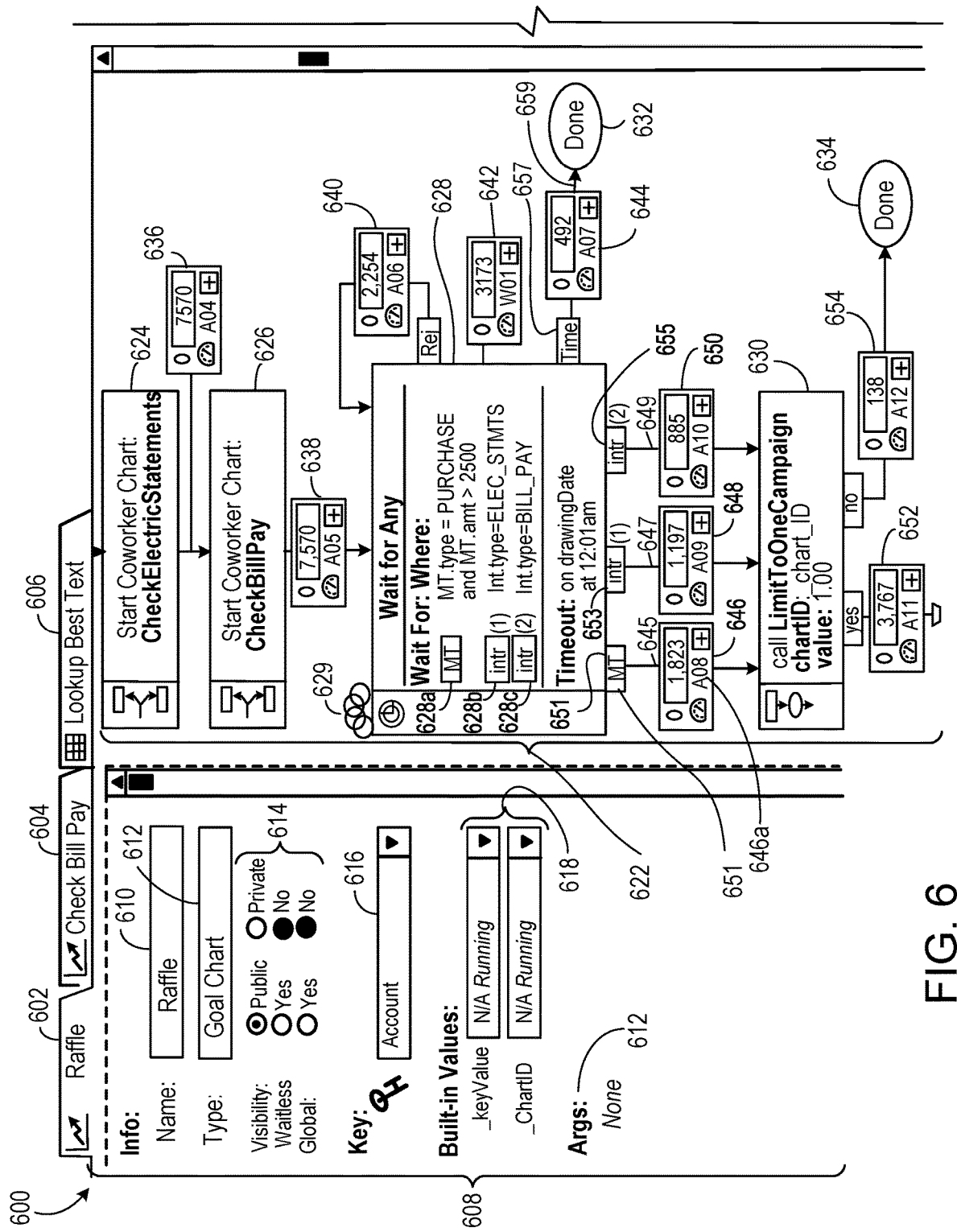
FIGS. 6-10 are example graphical user interfaces.

Referring to FIG. 6, graphical user interface 600 includes tabs 602, 604, 606. Generally, a tab includes a selectable portion of a graphical user interface, selection of which displays data associated with the selected tab. In this example, tab 602 is selected and graphical user interface 600 displays data pertaining to a particular raffle, i.e., the "Raffle." In this example, graphical user interface 600 includes portion 608 for displaying data pertaining to chart 622. Portion 608 includes name field 610 for entering and displaying data indicative of a name of chart 622. Portion 608 also includes type field 612 for entering and displaying data indicative of a chart type for chart 622. There are various types of charts, including, e.g., a goal chart. Generally, a goal chart includes a chart that describes a customer's process, for example, a single marketing campaign, and is a top-level chart that logically represents a CEP process of the user. Portion 608 also includes control portion 614 with controls for specifying whether chart 622 is private or publically visible, whether chart 622 is waitless (e.g., whether chart 622 includes a wait node), and whether chart 622 is a global chart. Portion 608 also includes key type field 616 for entering and displaying which type of key is used for chart 622. In this example, the key is an account identifier (e.g., an account number, an account number, and so forth). Portion 608 also includes built-in values controls 618 for displaying data indicative of which particular value of a key (_keyValue) is associated with data records that are currently being processed, e.g., when a chart is being executed in a test mode in which individual data records (for a particular value of a key) are stepped through (e.g., processed). Generally, stepping through data records includes sequentially processing data records that are arranged in a sequence, e.g., such that results of processing each data record are displayed prior to processing of a next data record in the sequence. Generally, a test mode includes a mode of operation in which a chart is executed with test data, e.g., a pre-defined set of data. By executing a chart in test mode, the system performs a time series of tests, e.g., testing a rule or a decision table expressed as a chart, with the testing being done over a period of time with data records that are separated in time. Built-in values controls 618 also display data indicative of an ID for an instance of a chart (_ChartID) that is currently being executed for a particular value of a key, e.g., when a chart is being run in test mode. In this example, built-in values controls 618 display a status of "running" to indicate that a chart is being run in real-time, e.g., rather than in a test mode in which individual data records (for a particular value of a key) are stepped through (e.g., processed). Portion 608 also includes arguments portion 620 for displaying arguments for a chart, when there are arguments for the chart. Generally, an argument includes a parameter. For example, a chart may include parameters the values of which are specified in a separate file and read into the chart. For example, logical expressions in a chart may include one or more parameters. At run-time, the system accesses a file that specifies values for these parameters and includes the values in the logical expressions. By doing so, the system promotes reuse of charts and logical expressions, because these charts and logical expressions do not include specified values. Rather, these charts and logical expressions include parameters, the values of which can be specified independent of the chart and logical expressions.

Chart 622 includes a visual representation of a rule and temporal relationships between portions of the rule. In this example, chart 622 includes nodes 624, 626, 628, 630, 632, 634. Each node represents one or more portions of the rule. The system executes chart 622 to test a degree of accuracy of execution of the rule, e.g., against data items or data records. For example, by the executing chart 622, the system determines which nodes (if any) fail to process data records. Such a failure may be indicative a conflict between portions of the rule or may be indicative of a portion of the rule that specifies a condition that is unlikely to be satisfied. As such, this failure may be indicative of a rule that is unable to accurately process data records or that processes data records in a manner that differs from a targeted processing style or goal.

Nodes 624, 626 are subchart nodes. Generally, a subchart node includes a node that represents executable logic for calling and executing a subchart. A subchart includes a chart for sharing logic among other charts, e.g., to avoid having to copy and paste sections of charts. A subchart provides for complexity abstraction and obfuscation. For example, a subchart could be created by a more technical user, but then used (called) by a less technical user, who does not have to be exposed to the more complex details of the implementation. A subchart is called from a calling chart, which includes a chart that calls (e.g., transfers control) to a subchart. A calling chart includes various types of charts, including, e.g., a goal chart or another subchart.

In this example, node 628 is a wait node (hereinafter wait node 628) and node 632, 634 are done nodes. Wait node 628 is configured to wait for any type of data record that satisfies at least one of three conditions 628a, 628b, 628c. Condition 628a requires that a data record be a monetary transaction (MT) external input data record indicative of a transaction that is greater than $2500. Condition 628b requires that a data record is an internal (intr) data record of an electronic statement type. Condition 628c requires that a data record is an internal data record of a bill pay type.

Chart 622 includes links 645, 647, 649, 659 and associated labels 651, 653, 655, 657, respectively. Generally, a label includes a visual representation of a satisfied condition. In this example, data records that satisfy condition 628a traverse from wait node 628 to node 630 via link 645 with label 651. The system causes a display in graphical user interface 600 of a visual representation of the transition from wait node 628 (e.g., which represents a wait state of the executable logic) to node 630 (e.g., which represents another state of the executable logic or one or more portions of the executable logic). The system may display (or cause display of) the visual representation of the transition by visually highlighting link 645.

In this example, data records that satisfy condition 628b traverse from wait node 628 to node 630 via link 647 with label 653. In this example, data records that satisfy condition 628c traverse from wait node 628 to node 630 via link 649 with label 655. If wait node 628 terminates because of a timeout, then the system updates a current position of chart 622 to done node 632, which is connected to wait node 628 through the path (i.e., link 659) with label 657.

Chart 622 includes status indicator 629 to specify which node of chart 622 is currently processing a data record. In this example, wait node 628 is currently being executed by the system, as specified by status indicator 629 being displayed in juxtaposition to (e.g., next to) wait node 628. Chart 622 includes monitoring points 636, 638, 640, 642, 644,

646, 648, 650, 652, 654. Generally, a monitoring point represents instructions for calculating particular metrics that are collected automatically, e.g., at run-time or during simulation and testing. Monitoring points are defined by users and are inserted by users into a chart. A monitoring point has a name, and the name is unique within a chart. In an example, the system uses a monitoring point to test a degree of accuracy of a rule, e.g., by monitoring how many data records pass through a particular node. If no data records pass through a node, the system identifies a potential problem with the logic included in that node and can prompt a user to review the logic and potentially adjust the logic. In this example, a monitoring point is displayed in chart 622 in juxtaposition to the node being monitored, e.g., to provide a visual indication of results of testing that node.

In an example, monitoring points allow users to perform calculations on data that is available at runtime, so that the run-time data can be included in a metric. For example, a user may want to know how many high valued customers (instead of all customers) took a specific branch of a particular decision node. To calculate that metric, a monitory point instruct the system to calculate, when the chart is executed, whether a customer is highly valued and to send back to the monitoring point data indicative of whether the customer is highly valued. If a monitoring point is defined in a subchart, it will be associated with the calling chart.

A monitoring point is attached to an arrow connecting two nodes in chart 622 or is attached to a wait node. For example, monitoring point 646 is associated with link 645, e.g., to track a number of data records satisfying condition 628*a* by tracking a number of data records that traverse link 645, as described below. Monitoring points 648, 650 are associated with links 647, 649, respectively, to track a number of data records traversing links 647, 649.

Graphical user interface 600 also includes portion 660 with tabs 662, 664, 666. Tab 662 causes a display of data pertaining to control of chart 622, as described in further detail below. Tab 664 causes a display of data pertaining to use of various objects in chart 622, as described in further detail below. Tab 666 causes display of data pertaining to monitoring points. Tab 666 includes portions 668 for displaying expressions information, portion 670 for displaying data pertaining to monitoring points associated with (e.g., attached to) arrows, portion 674 for displaying data pertaining to monitoring points associated with wait nodes and portion 674 for displaying metric data indicative of one or more results of execution of a chart and/or chart instances.

Portion 668 displays user-defined expressions 668*a*, 668*b*. An expression is associated with a name (e.g., "Total Qual"), a definition specifying how a value of the expression is computed by the system, and a value that is computed and output. In an example, an expression specifies a set of parameters, one or more local variables and/or a definition for specifying how a monitoring point is aggregated and reported.

Portions 670, 674 enable a user to define monitoring points, e.g., based on expressions 668*a*, 668*b*. In this example, portion 670 provides for specifying a definition of a monitoring point associated with an arrow. Portion 670 includes monitoring point definition 672 for specifying a definition for monitoring point 646. Accordingly, monitoring point 646 (which is generated from monitoring point definition 672) includes text "A 8" to specify that it is a monitoring point associated with an arrow ("A") and that it is the eighth such type of monitoring point. Monitoring point definition 672 specifies a name (i.e., "Qual by Pchs") of monitoring point 646 and also specifies various values 672*i*-672*l* to be tracked by monitoring point 646 and associated definitions 672*e*-672*h*, respectively, and names 672*a*-672*d*, respectively, for those values 672*i*-672*l*. Value 672*i* specifies how many data records have traversed arrow 645 between wait node 628 and node 630. In this example, value 672*i* is displayed in monitoring point 646, e.g., based on a user specification in portion 670 of which values to display in monitoring point 646. In this example, portion 670 includes one or more fields for definition of a new monitoring point.

Portion 674 includes a monitoring point definition for specifying a definition for monitoring point 642, which is associated with wait node 628, as specified by the "W" in monitoring point 642. In this example, the monitoring point definition in portion 674 specifies pending waiting blocks count 674*a*, wait block latency count 674*b*, and wait block latency average 674*c*. In this example, pending waiting blocks count 674*a* specifies a number of charts whose current position corresponds to wait node 628. Generally, a node includes a block. In this example, wait block latency count 674*b* specifies a number of instances where wait node 628 is satisfied (not timed out) during a specified time or reporting interval. In this example, wait block latency average 674*c* specifies an average data record processing latency for wait node 628. Generally, the average data record processing latency for a wait node includes a value indicative of an average time in which wait node 628 waits for a data record satisfying one or more of conditions 628*a*, 628*b*, 628*c* and processes the data record satisfying one or more of conditions 628*a*, 628*b*, 628*c*. In this example, monitoring point 642 displays a value (i.e., 3173) of pending wait blocks 674*a*, e.g., based on a user configuration of monitoring point 642 in portion 674. In particular, portion 674 includes one or more controls or entry fields (not shown) for a user to specify which values are displayed in monitoring point 642.

Portion 676 displays metrics, such as an active chart metric and a done chart metric. Generally, an active chart metric specifies a number of currently active (e.g., running) instances of a particular chart. Generally, a done chart metric specifies a numbers of instances of the chart that were previously active but are no longer active.

In a variation, portion 676 also displays other metrics indicative of a processing latency between when data records are put in an input queue and when they are processed. To do so, the system assigns an input data record an ingestion time, e.g., a time at which the data record is added to an input queue (e.g., for processing). When the system reads the data record from the input queue, the system calculates the processing latency by subtracting the ingestion time from a current time. The system also tracks average data record processing latency by calculating an average value of the metrics indicative of processing latency. In an example, the above-described metrics include global metrics (for data records processed by a set or plurality of charts) and per chart metrics.

In some examples, the system executes chart 622 on sets of items of test data, e.g., stored in a data repository. In this example, the system selects one of the sets and simulates a stream of near real-time test data using the selected set. The system applies a chart, such as chart 662, to items of test data in the simulated stream. In another example, an item of test data is an item of data received by the system, e.g., from one or more external sources.

Figure 7:
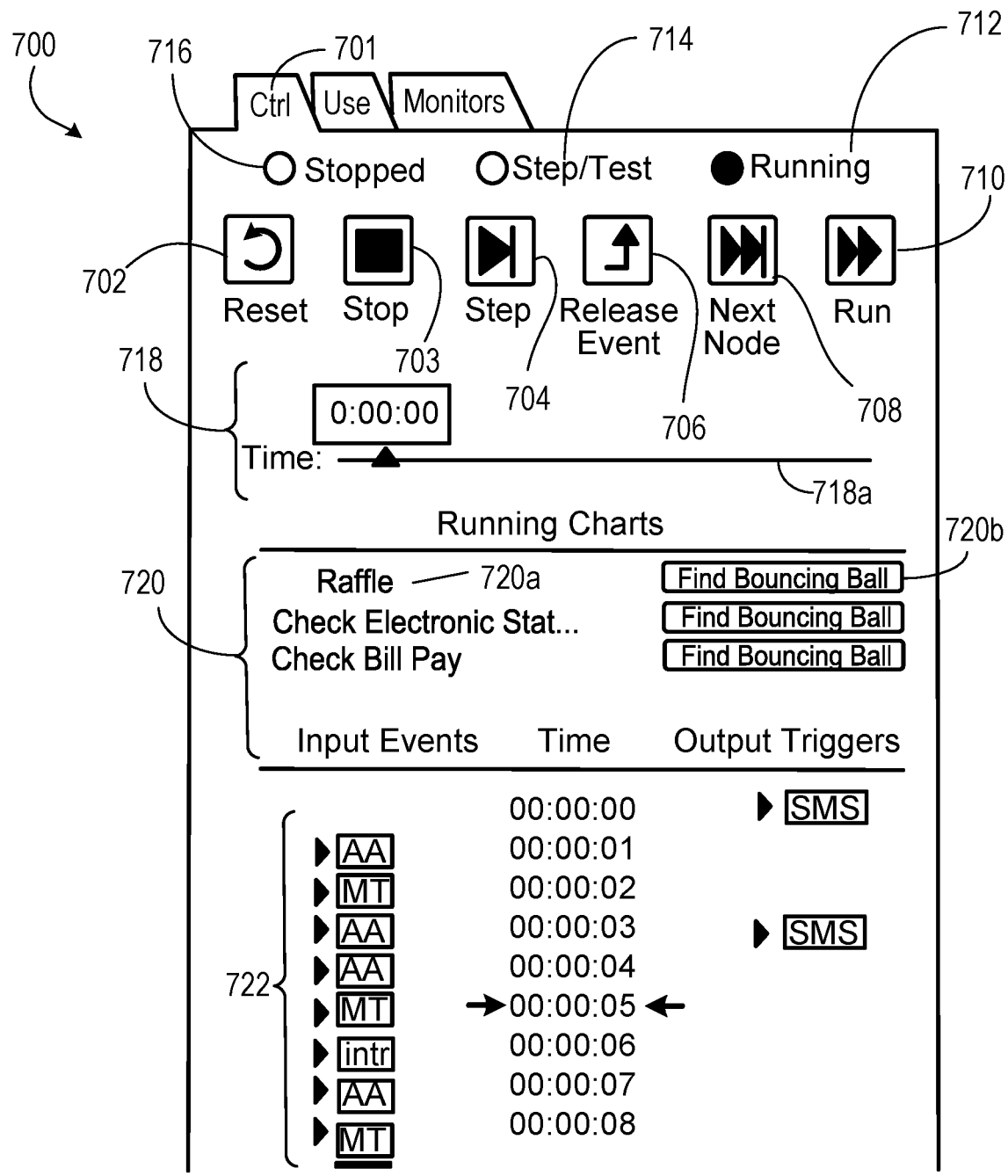

Referring to FIG. 7, graphical user interface 700 displays contents of tab 701 (which, for example, may correspond to tab 662). In this example, graphical user interface 700 displays reset control 702, stop control 703, step control 704, release control 706, next node control 708, and run control 710 for controlling execution of a chart, e.g., chart 622 in FIG. 6. Reset control 702 causes the chart to reset, e.g., when reset control 702 is selected. Generally, a chart is reset by terminating a currently executing instance of the chart and setting all variables used by the chart to have an initial value (e.g., a value of zero). Stop control 703 causes execution of a chart to stop, e.g., at least until a user specifies that the chart is to be run again.

Step 704 provides for temporal focused testing by enabling a user to step through data records (e.g., for a particular value of a key) to view how those data records are processed by a chart. As the system steps through the data records, the system updates the chart with a visual indication of which node is processing which data record and values of (or content of) that data record. For example, the logic of a chart (e.g., which embodies a rule) processes numerous data records. During testing, a user needs to see the records associated with a decision (e.g., a path traversed in the chart) for a given value of the key. By using step control 704, the system steps through each data record (for a particular value of a key) and visually highlights which node of a chart is currently processing a data record (or data records) and values for and contents of the data records being processed (as well as those data records that were previously processed), as described in further detail below. Release control 706 causes the system to release a data record. Generally, the release of a data record includes the processing and/or evaluation of a data record, e.g., so that the chart can continue to process new or incoming data records. Next node control 708 causes the system to change the state of a chart such that the state proceeds to a next node in the chart. Selection of this next node control 708 sends an instruction to the system to override a current state of a chart and to force the chart to advance to the next node, e.g., during testing—as described below. Run control 710 causes a chart to start or resume execution.

Graphical user interface 700 also display status indicators, such as, stopped indicator 716, step test indicator 714 and running indicator 712. In this example, stopped indicator 716 specifies that execution of a chart is currently stopped, e.g., when stopped indicator 716 is visually highlighted in graphical user interface 700. When visually highlighted in graphical user interface 700, step test indicator 714 specifies that a chart is currently being stepped through for testing, e.g., based on selection of step control 704. Running indicator 712 specifies that a chart is currently in execution, e.g., when running indicator 712 is visually highlighted in graphical user interface 700.

Graphical user interface 700 also includes elapsed time portion 718 that includes time bar 718a to visually specify an amount of time that has elapsed during execution of a chart. Graphical user interface 700 also includes running charts portion 720 that specifies which charts are currently being executed by the system. In this example, running charts portion 720 specifies that chart 720a is running. For chart 720a, running charts portion 720 includes control 720b, selection of which causes the system to identify and to display a status indicator specifying which node of chart 720a is currently being executed. Graphical user interface 700 also includes portion 722 that displays labels for various input data records, along with processing times for those data records (e.g., an amount of time that it takes a node in an executing chart to process the data record) and output triggers for associated input data records.

Figure 8:
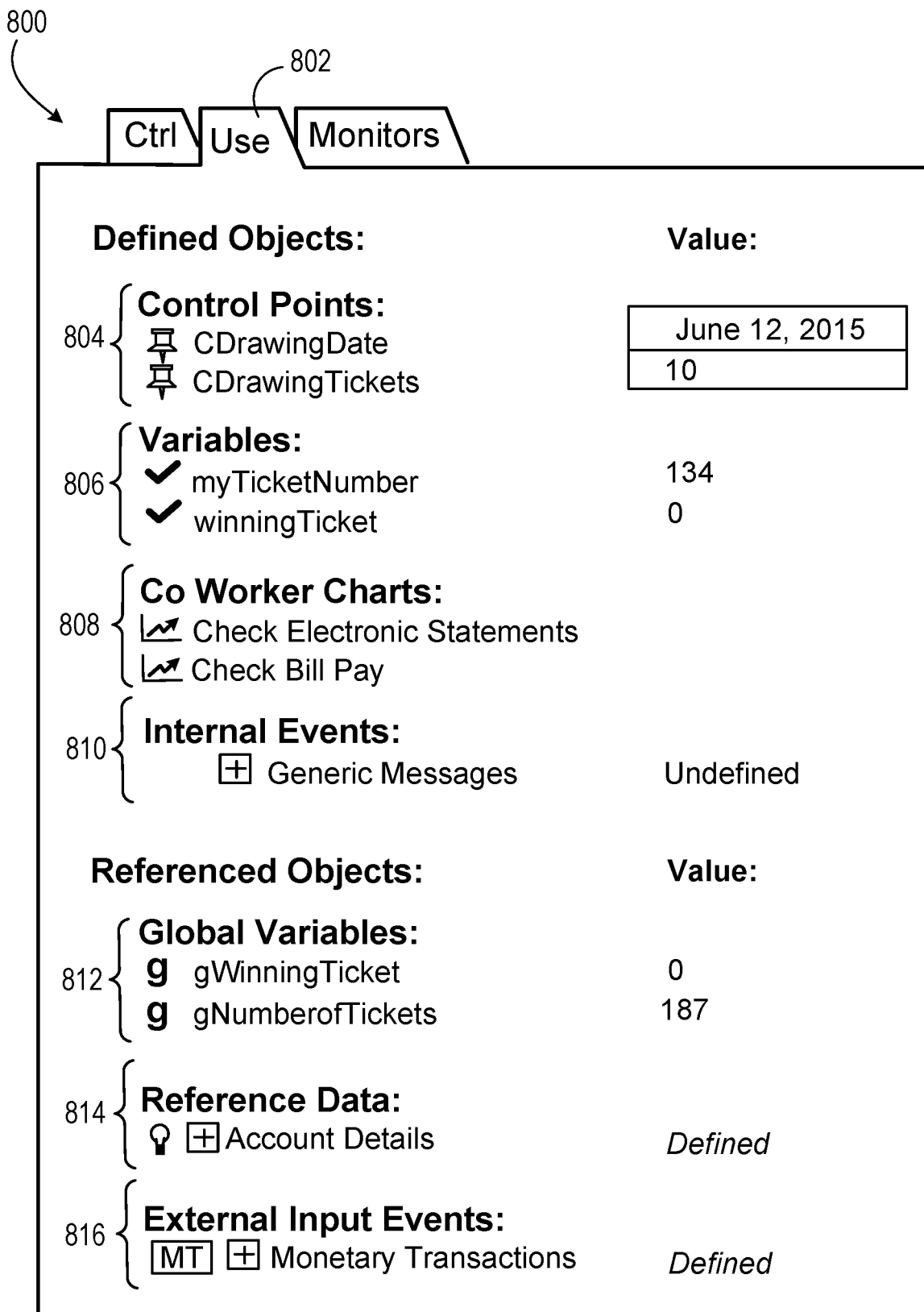

Referring to FIG. 8, graphical user interface 800 displays contents of tab 802 (e.g., which may correspond to tab 664 in FIG. 6). Graphical user interface 800 includes portion 804 for specifying control points (and associated values) that are used by one or more charts (e.g., chart 622 in FIG. 6). Graphical user interface 800 includes portion 806 that specifies variables (and associated values) that are used by the chart. Variables are assigned values, which can be computed using an expression, a rule, a subchart, and so forth.

Graphical user interface 800 also includes portion 808 for displaying coworker charts, e.g., that are used with a particular chart. Generally, a coworker chart includes a chart that is started by another chart and then runs independently with its own current position. The system may use a coworker chart, e.g., based on a restriction that a single chart is allowed to have single current position. For example, a goal chart may be configured to start an additional chart, which will have its own current position, and run in parallel with the goal chart. In this example, the additional chart is a coworker chart, and it communicates with other charts (like the goal chart that started it) using internal data records. Graphical user interface 800 also includes portion 810 for specifying internal data records used by the chart, portion 812 for specifying global variables used by the chart, portion 814 for specifying reference data used by the chart, and portion 816 for specifying external input data records used by the chart.

The charts described herein are configurable to perform windowed aggregations. Generally, a windowed aggregation is an aggregation of data (e.g., a specific type of data) over a specified time period or window. For example, a windowed aggregation includes an aggregation that is calculated for a subset of data records. The subset includes recent data records (e.g., data records in the last day), and as time advances, the set of data records that are aggregated also changes. Many CEP rules use windowed aggregations of various types (e.g., number of ATM withdrawals in the last 24 hours). Accordingly, the system generates windowed aggregations, generates rules to perform the aggregation and provides users with controls for defining these aggregations and for observing their behavior during testing. In an example, the executable logic includes or expresses an aggregation. In this example, the system computes the aggregation by executing a rule that represents the executable logic. Upon completion of computation of the aggregation, the system stores the aggregation for subsequent retrieval by one or more other rules that also include the aggregation—thereby promoting sharing of previously computed aggregations.

In an example, the system provides various pre-specified aggregations (e.g., number of texts used this month) that a user can select and use in generating a chart. In this example, the system provides an interface (or data for an interface) in which a user can define a chart, e.g., by "dragging and dropping" various nodes, icons and links into a portion of the interface for defining the chart. A node includes and displays logic, which is editable. A user may edit the logic to specify an aggregation that is used by the executable logic represented by the node or to specify other logic (which is used in compiling the executable logic). The user may specify an aggregation, e.g., by entering logic that specifies the aggregation, by selecting a predefined aggregation (e.g., from among a plurality of predefined aggregations), by selecting an icon or a node indicative of a predefined aggregation and adding it to the chart or associating it with a node in the chart, and so forth. The system tests the behavior of these aggregations by stepping through data records (e.g., for a particular value of a key) to identify which nodes process which data records and values of (and/or content in) the data records as they are processed. Based on this testing, the system may identify that data records do not pass through a node that includes an aggregation. As such, the system may analyze the logic in that node for errors (e.g., conditions that are never satisfied) and/or may prompt a user to alter the logic of the node to a condition that is more easily or frequently satisfied.

Referring back to FIG. 2, collect engine 61 calculates windowed aggregations and stores them as reference data or adds them to a data record as an enrichment. Generally, an enrichment includes data that is added to a data record, after the data record is received by the system. The system "enriches" the data record with this data. In another example, system 60 generates aggregations, e.g., based on a definition specified by an author of the chart (or of a rule embodied by the chart), and implements these aggregations as part of the chart execution process.

System 60 defines aggregations as variables, e.g., inside charts or inside projects. Generally, a project includes a collection of charts, e.g., a collection of charts for running a campaign. To enable sharing of aggregations among charts, system 60 defines aggregations for a project. By doing so, system performance and performance of individual charts is improved, e.g., by reducing a number of computations that system 60 performs in computing aggregations, relative to a number of computations that system 60 would need to perform in computing aggregations if system 60 computed aggregations for each chart independent of each other.

In an example, system 60 computes aggregations that are keyed (e.g., by being associated with a particular value of a key or with a particular key). System 60 generates rules for accessing aggregations across keys such that a chart may access the aggregations of a key that is the same as the key for the chart. In this example, system 60 computes windowed aggregations, moving window aggregations (e.g., an aggregation for the last 15 minutes), period aggregations (e.g., an aggregation for a series of defined time intervals), correlated aggregations (e.g., an aggregation that returns a value of one field based on a minimum or maximum of another field), and so forth.

In an example, a definition of an aggregation (hereinafter an aggregation definition) for a moving window aggregation is textually represented as follows:

For each customer, for each data record of type trade, where trade.action="buy", calculate the average of trade.amount over the last 15 minutes.

The underlined portions of the foregoing textual representation correspond to parameters in the aggregation definition generated by system 60. In this example, system 60 generates an aggregation with the parameters shown in the below Table 1:

TABLE 1

| Parameter Name | Parameter Description |
|---|---|
| Aggregation Name | This parameter specifies the name for the aggregation, which can be used in charts. In this example, the Aggregation Name is "Average Trade Amount - 15 min." |
| Data record Type | This parameter specifies an input data record type that triggers an update of this aggregation. In this example, the input data record type is a trade input data record type. |
| Key | This parameter specifies a key for the aggregation. In this example, the key is a customer identifier. |

TABLE 1-continued

| Parameter Name | Parameter Description |
|---|---|
| Filter Expression | This parameter specifies an optional expression that evaluates to a Boolean. When specified, only data records for which the computed value is true will be included in the aggregation. In this example, the filter expression is trade.action = "buy." |
| Aggregation Function(s) | This parameter specifies an aggregation function includes one or more of count, count distinct, sum, minimum, maximum, average, standard deviation, oldest, latest. In an example, system 60 provides a user interface for defining an aggregation and provides a drop down menu for selecting a particular aggregation function. |
| Field or Expression(s) | This parameter specifies what is being aggregated. For example, this parameter specifies a name of a field in a data record. In this example, the field parameter has a value of trade.amount. |
| Inclusive Flag | This parameter has a true or false value. If true, system 60 updates the aggregation before a chart is run based on a current data record. As such, system 60 includes the current data record in the aggregation. If false, system 60 updates the aggregation after a chart is executed based on a current data record. |
| Time Window | This parameter specifies a time period for the aggregation. In a user interface for defining an aggregation, an amount of time is selectable. |
| Granularity | This parameter is also a time period. Via the granularity parameter, system 60 optimizes and/or reduces (e.g., saves) memory consumption (e.g., relative to memory consumption independent of the granularity parameter) by collecting values together. For example, if the time window is 5 minutes and the granularity is 30 seconds, then a trailing edge of an aggregation window will shrink every 30 seconds, instead of for every data record. As such, a 5 minute window may represent 5 minutes plus 30 seconds of data. |

In the foregoing Table 1, an aggregation definition includes various parameters, which are used by system 60 in generating the aggregation. One or more of the parameters and/or values of the parameters are user configurable, e.g., during generation of a chart. For example, system 60 provides a user interface through which the user specifies values for one or more of the parameters shown in the above Table 1. Based on the specified values and the types of parameters, system 60 generates an aggregation definition and uses the aggregation definition in computing an aggregation for that aggregation definition.

System 60 also computes a period aggregation, including, e.g., an aggregation for a series of defined time intervals. A textual representation of a period aggregation is shown below:

For each customer, for each data record of type trade, where trade.action="buy", calculate the sum of trade.amount for each 30 second period in the last 10 minutes.

The underlined portions of the foregoing textual representation correspond to parameters in the aggregation definition for this period aggregation generated by system 60. For the period aggregation, system 60 generates an aggregation definition with an aggregation name parameter, a data record type parameter, a key parameter, a filter expression parameter, an aggregation function parameter, a field or expression parameter, as previously described with reference to Table 1. Additionally, this aggregation definition also includes the following parameters shown in the below Table 2:

TABLE 2

| Parameter Name | Parameter Description |
| --- | --- |
| Time Period | This parameter specifies a time period. It can be a longer period (e.g., 1 month) or a shorter period (e.g., 10 minutes). The total time windows covered by the aggregation will be the Time Period parameter times the Number of Periods parameter. |
| Number of Periods | This parameter specifies a number of complete time periods that are maintained. In an example, a value of the Time Period parameter is 1 month. In this example, if a value of the Number of Periods parameter is also 1, then system 60 maintains the aggregation for the last complete month, and also a partial aggregation for a current month. |
| Only Latest Flag | This parameter has a Boolean value of true or false. If true, then the period aggregation will be a scalar instead of a vector, and the value will be the value of the last complete period. If false, the period aggregation is a vector. |

The parameters shown in the foregoing Table 2 are configurable by a user, e.g., through a user interface of system 60. Additionally, system 60 computes correlated aggregations in which a correlation exists between a returned value and the aggregated value. An example correlated aggregation is shown below:

For each customer, for each data record of type trade, where trade.action="buy", calculate the symbol for the largest trade.amount seen in the last 20 minutes.

In this example, system 60 selects appropriate data records within the specified time window (i.e., 20 minutes) and returns a symbol (e.g., ^GSPC) satisfying the criteria specified by the aggregation (e.g., the largest trade.amount). System 60 also computes multi-period aggregations, in which system 60 computes a period aggregation and then an aggregation of the results of that period aggregation. An example period aggregation includes the following aggregation: For each customer, for each data record of type trade, where trade.action="buy", first calculate the sum of trade.amount for each day, then calculate the largest total for the last seven days.

System 60 computes aggregations as data records are received, e.g., for every data record as the data records arrive. These aggregations are near real-time aggregations, as they are computed in near real-time as data records are received. In an example, system 60 computes the aggregations independent of whether a chart tests or uses the values for the aggregations. In another example, system 60 computes the aggregations on-demand, e.g., when system 60 archives a stream of data records. Generally, an on-demand aggregation includes an aggregation that occurs in response to a request. In this example, system 60 archives a stream of data records, e.g., by storing in a data repository the data records or data indicative of the data records. In computing an aggregation on-demand, system 60 queries the data repository for an appropriate data record type, reads out the appropriate data records, identifies which of the appropriate data records match a required date range and calculates the aggregation as if the data records were arriving live. Generally, an appropriate data record includes a data record that satisfies one or more criteria or conditions. In an example, certain aggregations are infrequently used. In this example, rather than computing these certain aggregations for every incoming data record, system 60 computes on-demand aggregations for these particular aggregations to conserve system resources and to increase processing speed, relative to a processing speed for computing these aggregations in real-time as the data records are received. Additionally, system 60 implements on-demand aggregation for charts that run on a shorter time scale (e.g., running for a few days), but some of the logic uses a longer time scale aggregations (e.g., multiple months in the past). By doing so, system 60 reduces an amount of costly continuous computations of aggregations over longer time scales (relative to an amount of computations of these aggregations in real-time as the data records arrive). An aggregation definition specifies whether the aggregation is an on-demand aggregation or a near real-time aggregation. In some examples, a user specifies (e.g., in a user interface when defining the aggregation) whether the aggregation is a near real-time aggregation or an on-demand aggregation.

In an example, system 60 provides for shared rules and aggregations (e.g., logic is shared across multiple rules in a CEP system). By sharing rules and aggregations, system 60 increases a speed at which it can process incoming data records, e.g., by not being consumed with calculating a same aggregation multiple times, relative to a speed of processing incoming data records independent of sharing of rules and aggregations. For example, system 60 calculates once aggregations that are needed by multiple rules and stores values for those aggregations in a data repository or memory cache. In another example, system 60 stores in a data repository the logic of a node (e.g., decision logic in a node). This logic may then be reused in the calculation of multiple other separately maintained decisions, e.g., as specified by other nodes.

Figure 9:
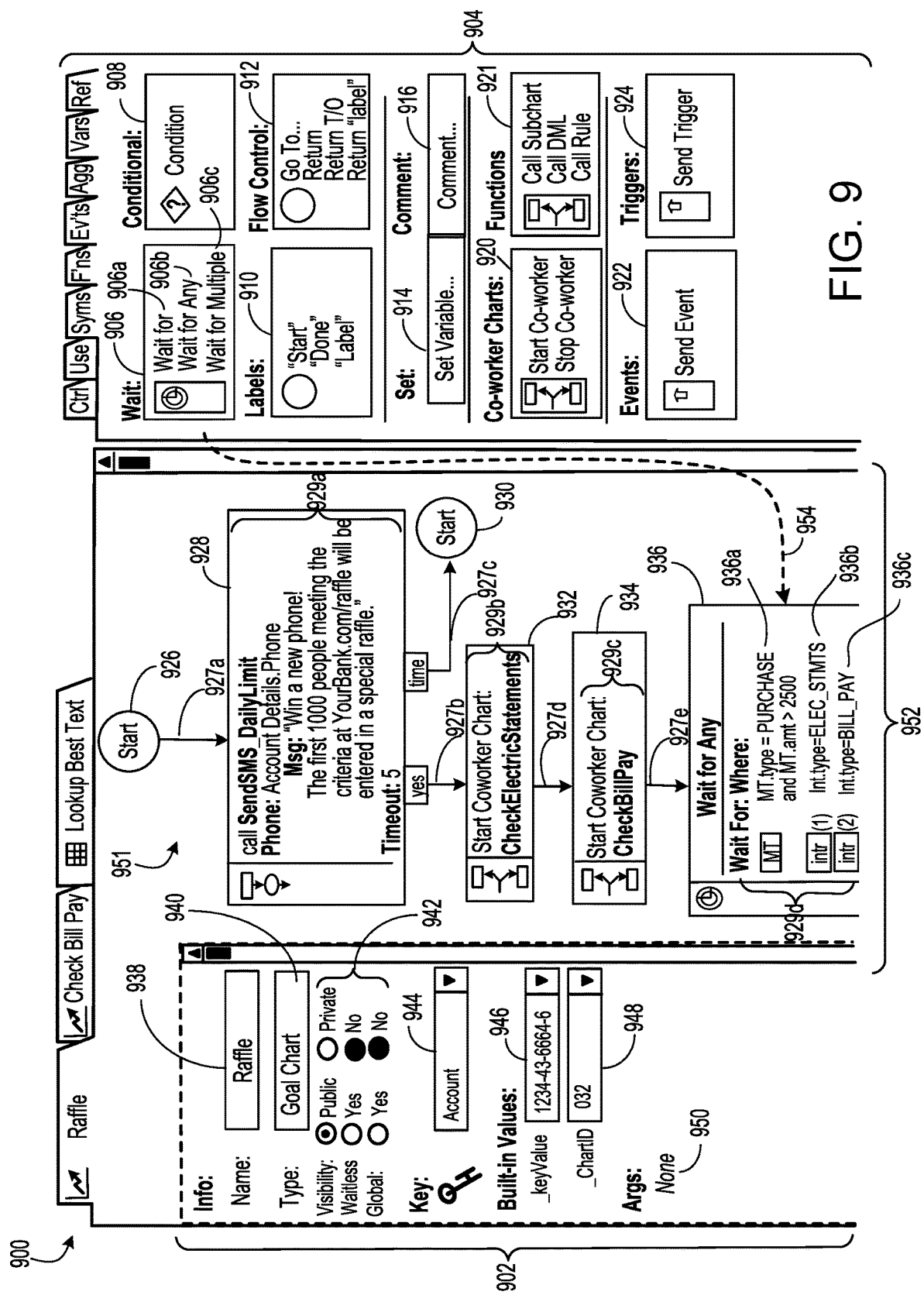

Referring to FIG. 9, graphical user interface 900 (e.g., an editing interface) provides a "drag and drop" interface for creating a chart. In this example, the system generates graphical user interface 900 (or provides data for graphical user interface 900) to provide a graphical programming model for generation of charts that describe a time series of tests or rules (e.g., a rule to process data records that are separated in time) and that visually illustrate which portions of a rule or test process which data records. Using graphical user interface 900, a user may define a flowchart style of rule.

Graphical user interface 900 includes portion 902, which displays data pertaining to the chart being created. Portion 902 includes name field 938 for specifying a name of the chart, type field 940 for specifying a chart type and visibility controls 942 for specifying whether the chart is publically or privately visible, whether the chart is waitless and whether the chart is a global chart. Portion 902 also includes key type field 944 for specifying a type of key for the chart. Portion 902 includes keyValue field 946 for specifying a sample value of a key for which the chart is being generated or constructed. For example, a user can use _keyValue field 946 to select a particular value of the key and test the chart (as it is being built) for that value of the key, e.g., by using a step control (such as step control 704 in FIG. 7). Portion 902 also includes chartID field 948 for specifying an ID for an instance of the chart that is being executed for that particular value of the key specified in _keyValue field 946. Portion 902 also includes arguments field 950, if there are arguments.

Graphical user interface 900 also includes portion 904, which includes selectable nodes 906, 908, 910, 912, 914, 916, 918, 920, 921, 922, 924, and editing pane 952 for creating a flowchart. In this example, an editing pane includes an editable display of a specification for associating one or more logical expressions with a node or for editing one or more logical expressions associated with a node or the specification. In this example, the system generates data for graphical user interface 900.

Each of these selectable nodes is configured to be "dragged and dropped" into editing pane 952 to add a node to the flowchart. In this example, editing pane 952 includes nodes 926, 928, 930, 932, 934, 936, each of which is added to editing pane 952 by selecting an appropriate selectable node and dragging and dropping that selectable node into editing pane 952. In an example, a node includes one or more editable portions for input of one or more logical expressions. In another example, selection of one or more portions of a node causes display of a graphical user interface (e.g., a prompt box) for entry of one or more logical expressions, for editing of one or more logical expressions, and so forth. In this example, the graphical user interface (that is displayed based on selection of one or more portions of the node) is displayed as an overlay to graphical user interface 900. Based on the one or more logical expressions specified in the graphical user interface (that is displayed based on selection of one or more portions of the node), a node includes the one or more logical expressions and/or a visualization of those one or more logical expressions. In another example, the node displays other data that is based on the one more logical expressions, e.g., by displaying a sentence that explains the one or more logical representations.

For example, node 936 is added to editing pane 952 by selecting selectable node 906 and dragging and dropping selectable node 906 into editing pane 952, in accordance with a drag-and-drop traversal specified by arrow 954. Once selectable node 906 is in editing pane 952, a user may configure selectable node 906 to transform it into the node that is used by the chart, e.g., node 936. In this example, selectable node 906 includes selectable portions 906a, 906b, 906c, each of which specify a type of wait to be implemented. Selectable portion 906a specifies a wait type of waiting for a particular data record. Selectable portion 906b specifies a wait type of waiting for any data record that satisfies at least one criteria (from among a plurality of different criteria). Selectable portion 906c specifies a wait type of waiting for multiple data records that together satisfy specified criteria.

In this example, a user selects selectable portion 906a to specify that node 936 waits for any data record that satisfies one or more specified criteria. Selectable node 906 also includes other editable fields (not shown) for a user to input data specifying one or more criteria indicative of a type of data record for which a wait node is configured to wait. In this example, the user-specified criteria (entered into selectable node 906) is displayed in portions 936a, 936b, 936c of node 936. (In this example, portion 929d includes portions 936a, 936b, 936c.). In this example, a user adds nodes 926, 928, 930, 932, 934, 936 to editing pane 952 to define a chart for execution. In the editing pane 952, nodes 926, 928, 930, 932, 934, 936 are editable, e.g., by editing the logic in a node. In an example, the system receives data indicative of one or more edits to one or more logical expressions of one or more of nodes 926, 928, 930, 932, 934, 936 and data specifying which one of nodes 926, 928, 930, 932, 934, 936 is associated with the one or more logical expressions received.

In this example, editor interface 900 displays chart 951 with nodes 926, 928, 930, 932, 934, 936 and links 927a-927e. Editor interface 900 includes portions 929a-929d for inputting or editing one or more logical expressions in relation to one or more of nodes 926, 928, 930, 932, 934, 936. For example, editor interface 900 includes portion 929a for inputting or editing one or more logical expressions in relation to node 928. In a variation, the one or more portions for inputting or editing the logical expressions are located outside the nodes, are located in proximity to the nodes, are juxtaposed to the nodes, are next to the nodes, are displayed in another user interface (e.g., following selection and/or clicking on a node) and so forth. In this example, one or more of nodes 926, 928, 930, 932, 934, 936 correspond to a particular state of the state machine. A logical expression (e.g., "Start Coworker Chart: CheckElectricStatements," and "call SendSMS_DailyLimit, Phone: Account Details.Phone, Msg: "Win a new phone! The first 1000 people meeting the criteria at YourBank.com/raffle will be entered in a special raffle") represents at least partial processing of a data record when the state machine is in the particular state. In particular, the logical expression represents how the data record is processed (e.g., what operations are performed) when the state machine is in a particular state.

In this example, a link (e.g., one of links 927a-927d) between one of the nodes and another one of the nodes represents a transition of the state machine from one state to another state. In this example, system 11 (FIG. 2) transforms the one or more logical expressions and chart 951 into executable logic for implementing a state machine for: as data records are intermittently received, evaluating one or more fields in the data records to identify values of the key. For example, system 11 concatenates together values of a field to produce a value of a key, modifies a format of a value of a field to produce a value of a key, appends data to a value of a field to produce a value of a key, selects a value of a field to produce a value of a key, and so forth. For each value of the key, system 11 implements the state machine to process one or more first data records including one or more fields on which that value of the key is based, with the processing being in accordance with one or more logical expressions that are in relation to one or more nodes corresponding to a current state of the state machine, with respect to that value of the key. For example, when the state machine is in a state corresponding to node 928, the system applies to a received record one or more portions of executable logic corresponding to (or based on) the logical expression (i.e., "call SendSMS_DailyLimit, Phone: Account Details.Phone, Msg: "Win a new phone! The first 1000 people meeting the criteria at YourBank.com/raffle will be entered in a special raffle") that is in relation to node 928. The state machine generated from nodes 926, 928, 930, 932, 934, 936, links 927a-927e and logical expressions also transitions, in accordance with a link of chart 951, to another state for processing one or more second data records of the intermittently received data records. In this example, the one or more second data records include the one or more fields on which that value of the key is based, and are received after the one or more first data records.

Figure 10:
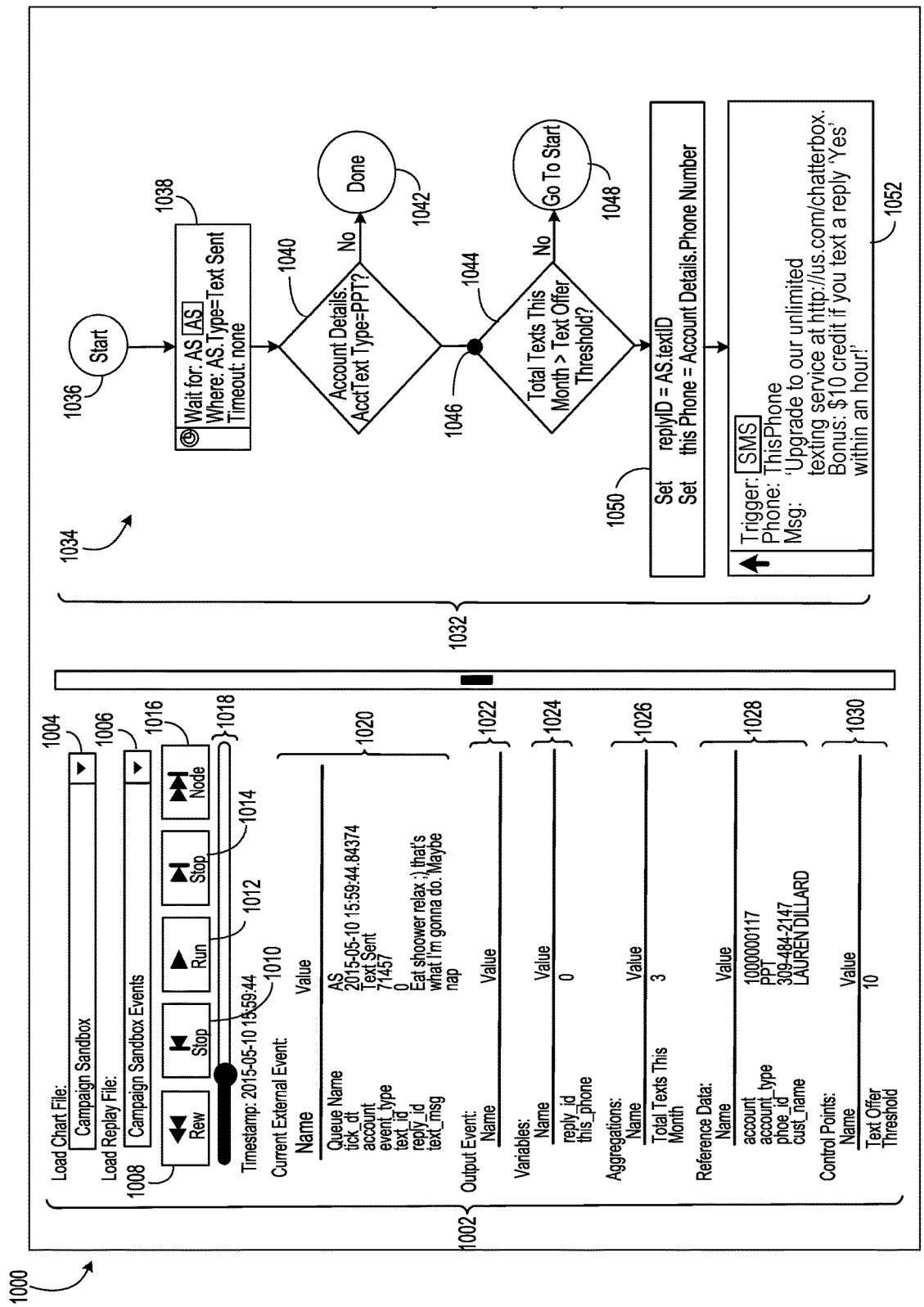

Referring to FIG. 10, graphical user interface 1000 includes portion 1032 for displaying chart 1034 and portion 1002 for displaying details of testing chart 1034, e.g., with a set of records that pertain to a particular value of a key, and for displaying controls for testing of chart 1034. Portion 1002 includes selection control 1004 for selecting a name of a chart to be used in testing. Portion 1002 also includes selection control 1006 for selecting a set of test data to be used in testing chart 1034. In this example, the set of test data includes a sequence of data records (e.g., the "campaign sandbox data records") that are associated with a particular value of a key and that are used for testing. The data records in this sequence of data records are referred to herein as test data records. In an example, the test data records include data records that were previously received by the system. In another example, the test data records are based on data records that are received by the system, e.g., by obfuscating or modifying content of received data records to generate the test data records. In this example, the key for chart 1034 is an account ID. The data records specified by selection control 1006 are data records associated with an account ID of "1000000117," as shown in portion 1028.

Portion 1002 also includes rewind control 1008, selection of which instructs the system to "rewind" testing, e.g., by returning to test a prior node. For example, selection of rewind control 1008 instructs the system to return to testing a node that is immediately before a current node being tested. Portion 1002 also includes step backward control 1010, selection of which instructs the system to return to testing chart 1034 with a previously tested data record. Portion 1002 also includes run control 1012, selection of which instructs the system to start testing chart 1034 with data records specified by selection control 1006, e.g., by applying chart 1034 to those data records. Portion 1002 includes step forward control 1014, selection of which instructs the system to test chart 1034 with the next data record included in the data records being tested. In this example, the data records include a sequence of data records. As such, selection of step forward control 1014 causes chart 1034 to be applied to the next data record in the sequence for testing. Portion 1002 includes forward node control 1016, selection of which instructs the system to advance to testing the next node in chart 1034. Portion 1002 also includes timescale 1018 for representing the progress of testing chart 1034.

Portion 1002 also includes portions 1020, 1022, 1024, 1026, 1028, 1030. In this example, portion 1020 displays current external data record data that is indicative of an external data record currently being processed by chart 1034. Hereinafter, portion 1020 is referred to as current external data record portion 1020. In this example, the external data record currently being processed is received in an activity stream ("AS") queue (e.g., a queue that subscribes to AS external data records for processing by chart 1034) and is associated with an account ID of 1000000117. Additionally, the external data record is a text sent data record that includes a text message. Portion 1022 displays which output data records, if any, are being executed or processed. Portion 1024 displays which variables (e.g., variables associated with the tested data record or first one of data items) are used by chart 1034 and associated values for the variables. Portion 1026 specifies aggregations that the system computes and that are used in chart 1034. In this example, the system computes an aggregation of "total texts this month." Portion 1028 displays reference data that is used by chart 1034. The reference data may be compared to result data outputted by executing the chart 1034 to identify any potential deviation between them. Portion 1030 displays control points that are used by chart 1034.

Chart 1034 includes nodes 1036, 1038, 1040, 1042, 1044, 1048, 1050, 1052 and status indicator 1046 to specify which node of chart 1034 (or which portion of executable logic) is currently being tested. In this example, the system is currently testing node 1044, as specified by status indicator 1046 being in proximity to node 1044. The system is testing node 1044 with the data record represented in current external data record portion 1020. In this example, node 1044 includes a decision node and includes (or displays) a logical expression that is based on the aggregation represented in portion 1026 and the control point represented in portion 1030. Selection of rewind control 1008 causes the system to return to testing node 1040 with one or more previously processed data records. Selection of forward node control 1016 causes the system to test node 1050 or node 1048 and related data records. Through controls 1008, 1016, a user can specify which nodes of chart 1034 are tested.

Selection of step backward control 1010 causes the system to step back through data records (associated with a particular value of the key) and test a prior data record (in a sequence of data records that are being tested). Selection of step forward control 1014 causes the system to step forward through data records and to test a next data record in the sequence (e.g., by processing a next data record with one or more appropriate nodes). Using controls 1008 and 1014, a user may step through data records to identify which nodes are applied to which data records. As the user steps through data records, results of processing a particular data record with chart 1034 are displayed with chart 1034, e.g., in portion 1002. For example, the results may include generating an output data record (for which data is displayed in portion 1022), computing aggregations (the results of which are displayed in portion 1026), setting values for variables (as displayed in portion 1024, e.g., variable associated with the tested data record or first one of data items), and so forth. Portion 1032 also displays a result of processing a data record, e.g., by displaying status indicator 1046, which represents whether processing of a data record results in a change of a current node.

In this example, status indicator 1046 enables a user to test chart 1034 by providing a visual indication of which nodes (or which executable logic) are being executed and of how (e.g., in which order, with which executable logic and/or rendering which result data) the data records are being processed. The graphical user interface 1000 provides indicators of the currently processed data item or data record, the executable logic currently applied to the data item or data record, and/or the result data rendered by the application of the executable logic to the data item or data record. The result data thereby may be rendered as output from processing the data item or data record according to the program instructions specified in the applied executable logic. The one or more means of feedback described herein directly support the user in properly operating the underlying system or in assessing whether the underlying system is properly operating.

For example, a user selection (1006) of the first one of the data items of the stream may be received, a display of an indication of the first one of the data items of the stream currently being processed by the data processing system may be caused, and a display of an indication of the one or more portions of the executable logic currently being applied to the first one of the data items to obtain the result data may be caused.

For example, the portion of the result data may be compared with predetermined reference data (1022 or 1028). It may be determined if a deviation exists between the portion of the result data and the predetermined reference data or if such a deviation does not exist; and an indication may be outputted whether the portion of the result data is in agreement with the predetermined reference data based on the determining if a deviation exists between the portion of the result data and the predetermined reference data or if such a deviation does not exist.

For example, the first one of the data items of the stream currently being processed by the data processing system may be compared with a predetermined reference data item (1006 or 1028); it may be determined if a deviation exists between the first one of the data items of the stream currently being processed and the predetermined reference data item or if such a deviation does not exist; and an indication may be outputted whether the first one of the data items of the stream currently being processed is in agreement with the predetermined reference data item based on the determining if a deviation exists between the first one of the data items of the stream currently being processed and the predetermined reference data item or if such a deviation does not exist.

For example, the one or more portions of the executable logic currently being applied to the first one of the data items to obtain the result data may be compared with a predetermined reference executable logic; it may be determined if a deviation exists between the one or more portions of the executable logic currently being applied to the first one of the data items and the predetermined reference executable logic or if such a deviation does not exist; and an indication may be outputted whether the or more portions of the executable logic currently being applied to the first one of the data items to obtain the result data is in agreement with the predetermined reference executable logic based on the determining if a deviation exists between the one or more portions of the executable logic currently being applied to the first one of the data items and the predetermined reference executable logic or if such a deviation does not exist.

In case the expression "deviation" is used herein, a deviation within a certain tolerance margin may be accepted to determine a compliance or agreement with the respective reference. Alternatively, an exact match with the respective reference may be required to determine a compliance or agreement with the respective reference.

For example, if status indicator 1046 is never associated with a particular node, then the user is alerted to the fact that the node may include logically inconsistent expressions or be associated with criteria that prdata record the node from being executed. Additionally, status indicator 1046 specifies how the data records are processed through flowchart 1034. In this example, if a user expects the data records to be processed in one manner (e.g., by traversing a particular path through a graph) but status indicator 1046 specifies that the data records are processed in a different manner, the user can modify one or more nodes in chart 1034 or can modify the logical expressions associated with a node (e.g., in the executable logic) to achieve a desired manner of processing data records through chart 1034. In summary, to assist the user in properly operating the underlying system, feedback is provided, e.g. through portions 1022, 1024, 1026, 1028, 1030 and indicator 1046, whether (i) the correct executable logic (ii) was correctly applied to (iii) the correct data item or data record.

Figure 11:
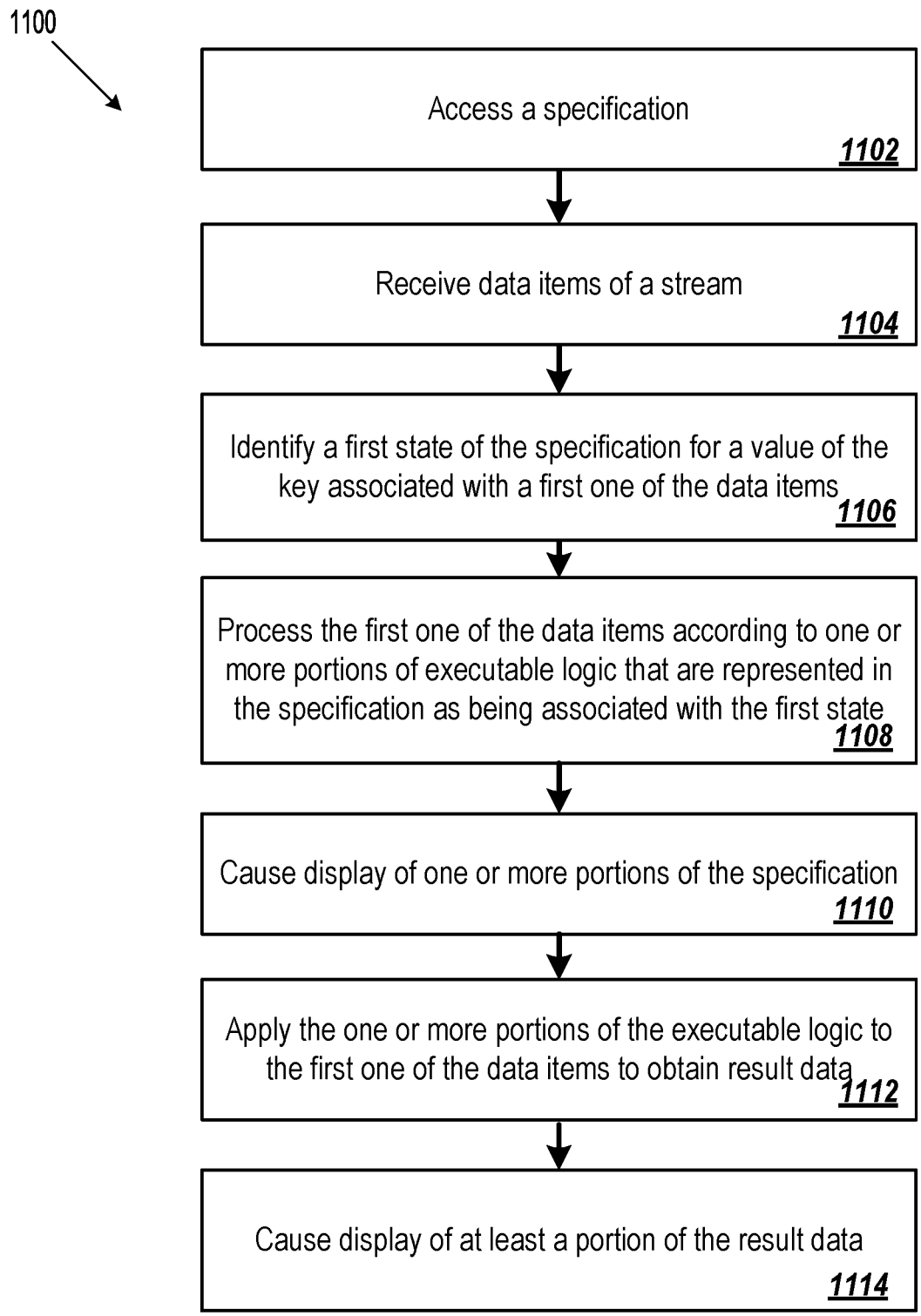

Referring to FIG. 11, the system executes process 1100 for processing data items (e.g., data records) of a stream of data items according to a specification that is associated with a key. A data item is associated with a value of the key, e.g., by content included in the data item being associated in a data repository with the value of the key. In this example, the system maintains states of the specification for respective values of the key. The specification represents executable logic and is stored, by the system, in a data storage system.

In operation, the system accesses (1102) the specification that represents the executable logic. In this example, a state of the specification for a particular value of the key specifies one or more portions of the executable logic that are executable in that state. The system receives (1104), over an input device or port, data items of a stream of data, e.g., data items via a network connection. For a first one of the data items of the stream, the system identifies (1106) a first state of the specification for a value of the key associated with that first one of the data items. The system processes (1108) the first one of the data items according to one or more portions of executable logic that are represented in the specification as being associated with the first state. The system causes (1110) display of one or more portions of the specification, e.g., in a graphical user interface. The system applies (1112) the one or more portions of the executable logic to the first one of the data items to obtain result data, e.g., one or more portions of the executable logic executed using the first one of the data items as input for the executable logic to obtain the result data is output of the executable logic after the execution. The system causes (1114) display of at least a portion of the result data with at least one of the one or more portions of the specification displayed, e.g., by displaying the result data in juxtaposition to a node in the specification, by displaying the result data in a portion of the graphical user interface for displaying results (with another portion of the graphical user interface displaying one or more portions of the specification), and so forth. The system also causes the specification, with respect to the value of the key (e.g., only with respect to this value of the key) for the first one of the data items, to transition from the first state to a second state, e.g., by updating a portion of the in-memory data grid, e.g., a data structure stored in volatile memory, (for storing a state for that value of the key) with data indicative of a current position of the chart, with regard to that value of the key. By using the in-memory data grid, a processing speed of the system is increased, relative to a processing speed of the system if data was being stored to electromechanical mass storage media such as hard disks. By using the in-memory data grid, the system writes data to, and reads data from, memory more quickly than writing and reading data to a hard disk. Additionally, the key/value data structure of the in-memory data grid provides for faster data retrieval times, e.g., relative to retrieval times with relational data structures (e.g., such as strings and directed graphs). Generally, a key-value structure includes a data structure with arrays, in which an array includes a key and a value of that key (or a hashed value of the key).

Figure 12:
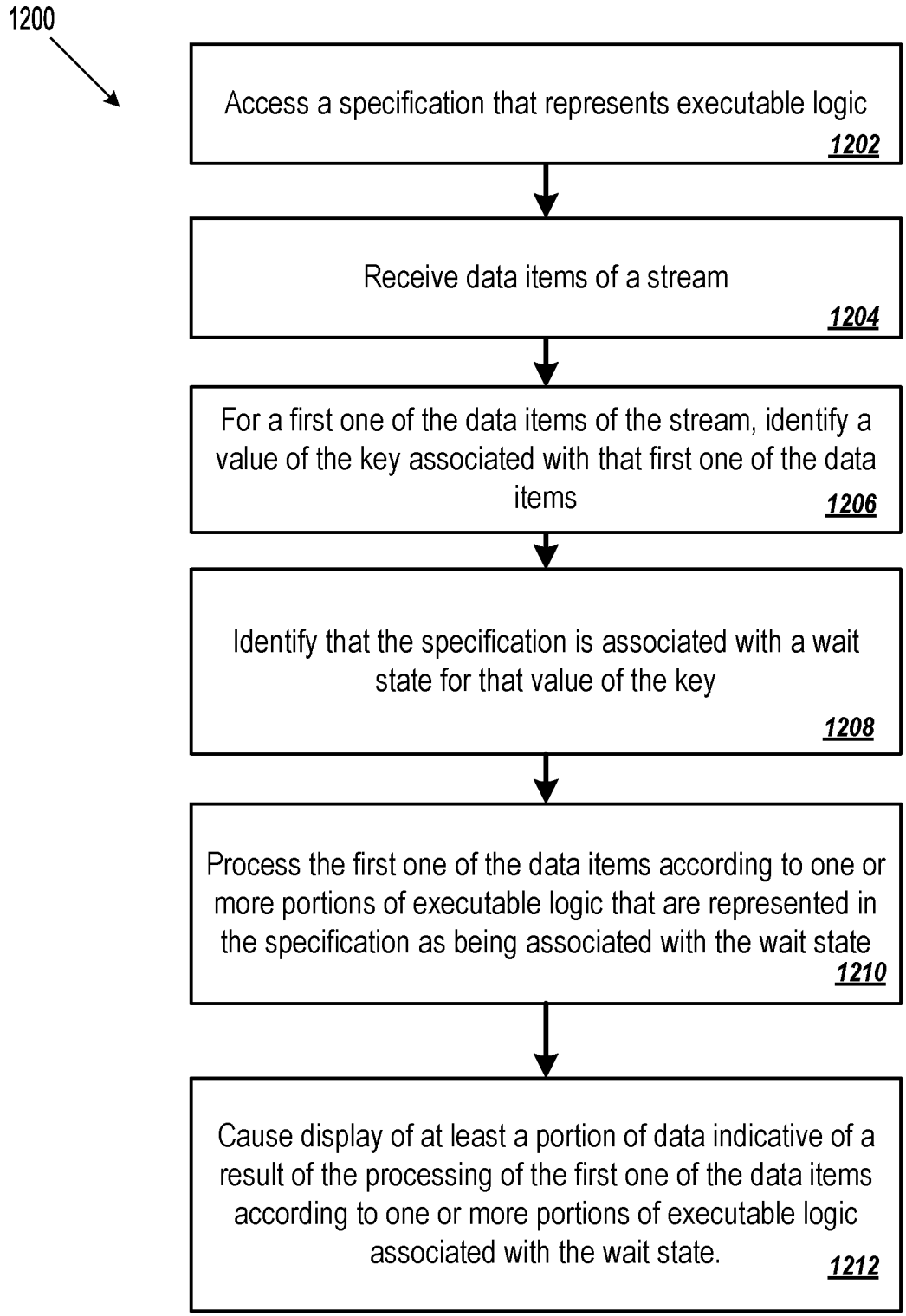

Referring to FIG. 12, the system implements process 1200 in processing data items of a stream of data items according to a specification that is associated with a key. In this example, a data item is associated with a value of the key. The system maintains states of the specification for respective values of the key. Additionally, the specification represents executable logic being stored in a data storage system.

In operation, the system accesses (1202) the specification that represents the executable logic. In this example, a state of the specification for a particular value of the key specifies one or more portions of the executable logic that are executable in that state. The system receives (1204), over an input device or port, data items of a stream of data. For a first one of the data items of the stream, the system identifies (1206) a value of the key associated with that first one of the data items, e.g., based on contents of the data record or based on a value included in the data record, as previously described. The system also identifies (1208) that the specification is associated with a wait state for that value of the key. In the wait state, the executable logic is waiting for one or more data items that are associated with that value of the key and that are separated in time from one or more other data items that are located before the one or more data items in the stream. In this example, the system identifies that the specification is in a wait state by looking-up (e.g., in the in-memory data grid) state data that is associated with the value of the key. In this example, the state data specifies that a current node is a wait node or otherwise specifies that a current state is a wait state.

The system processes (1210) the first one of the data items according to one or more portions of executable logic that are represented in the specification as being associated with the wait state. The system causes (1212) display of at least a portion of data (e.g., a status indicator, data indicative of an output data record, etc.) indicative of a result of the processing of the first one of the data items according to one or more portions of executable logic associated with the wait state.

Figure 13:
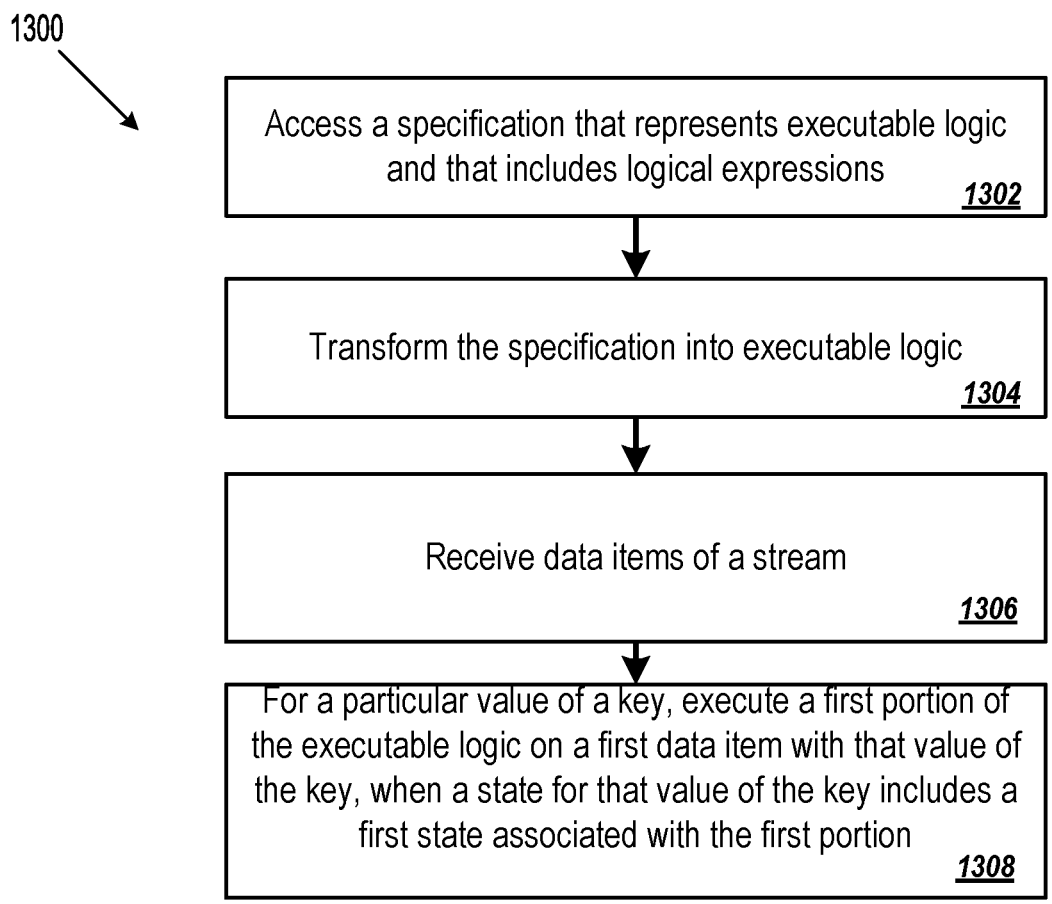

Referring to FIG. 13, the system implements process 1300 to process data items of a stream of data according to a specification that is associated with a key and that represents executable logic. In this example, a data item is associated with a value of the key. The system maintains states of the specification for respective values of the key.

In operation, the system accesses (1302) the specification that represents the executable logic. In this example, a state of the specification for a particular value of the key specifies one or more portions of the executable logic that are executable in that state. In this example, the specification includes logical expressions, nodes and one or more links. First nodes (e.g., nodes 2a, 2b, 2c in FIG. 1A) represent a first state of the specification (or the executable logic), with respect to a value of the key, in which a first portion of the executable logic is executable on a first one of the data items associated with that value of the key. At least one of the first nodes includes a first visualization that is based on one or more first logical expressions that at least partly correspond to the first portion of the executable logic (e.g., logical expressions in portion 120b of FIG. 4).

One or more second nodes (e.g., nodes 2d, 2e, 2f) represent a second state of the specification (or the executable logic), with respect to the value of the key, in which the second portion of the executable logic is executable on a second one of the data items associated with that value of the key and that is located after the first one of the data items in the stream. In this example, a link (e.g., link 2i in FIG. 1A) between one of the first nodes and one of the one or more second nodes represents a transition of the specification (or the executable logic), with respect to that value of the key, from the first state to the second state.

The system transforms (1304) the logical expressions in the specification into executable logic. For example, a dataflow graph or chart includes vertices (representing data processing components or datasets) connected by directed links (representing flows of work elements, i.e., data) between the vertices. A system for executing such dataflow graphs is described in U.S. Pat. No. 5,966,072, titled "Executing Computations Expressed as Graphs," the entire contents of which are incorporated herein by reference. Dataflow graphs made in accordance with this system provide methods for getting data into and out of individual processes represented by graph components, for moving data between the processes, and for defining a running order for the processes. This system includes algorithms that choose inter-process communication methods from any available methods (for example, communication paths according to the links of the graph can use TCP/IP or UNIX domain sockets, or use shared memory to pass data between the processes).

For each value of the key, the first portion of executable logic represented by the first nodes (e.g., nodes 2a, 2b, 2c in FIG. 1A), which is associated with the first state, is executable on a first data item with that value of the key, when a state for that value of the key includes the first state. The executable logic is configured for the transition represented by the link (e.g., link 2i in FIG. 1A) from the first state to the second state, following execution of the first portion. The second portion of executable logic represented by the one or more second nodes (e.g., nodes 2d, 2e, 2f in FIG. 1A) is executable on a second data item with that value of the key, when the state for that value of the key includes the second state. In this example, the system receives (1306) data items of a stream of data. For a particular value of the key, the system identifies a state associated with that key. In this example, the key is associated with a first state that includes nodes 2a, 2b, 2c. The system also looks up a current position to identify which of nodes 2a, 2b, 2c is a current node. In this example, node 2c is a current node.

The system executes (1308) a first portion of the executable logic on a first data item with that value of the key, when a state for that value of the key includes a first state (e.g., as represented a data structure for that value of the key in an in-memory data grid) that is associated with the first portion. In this example, the system executes a portion of the executable logic represented by node 2c, because the state for that value of the key is the first state (which is associated with one or more portions of the executable logic represented by node 2c) and a current position is node 2c.

In an example, one of the second nodes includes a wait node that represents a portion of the executable logic that is configured to wait for a second one of the data items with that value of the key. In this example, another one of the second nodes (e.g., send node 2e in FIG. 1A) represents another portion of the executable logic that is configured to cause execution of one or more actions, e.g., such as sending a message. In this example, link 2i represents a state transition of the specification, with respect to that value of the key, from the first state, in which the first portion is executable, to the second state, in which the executable logic is configured to wait for the second one of the data items.

Figure 14:
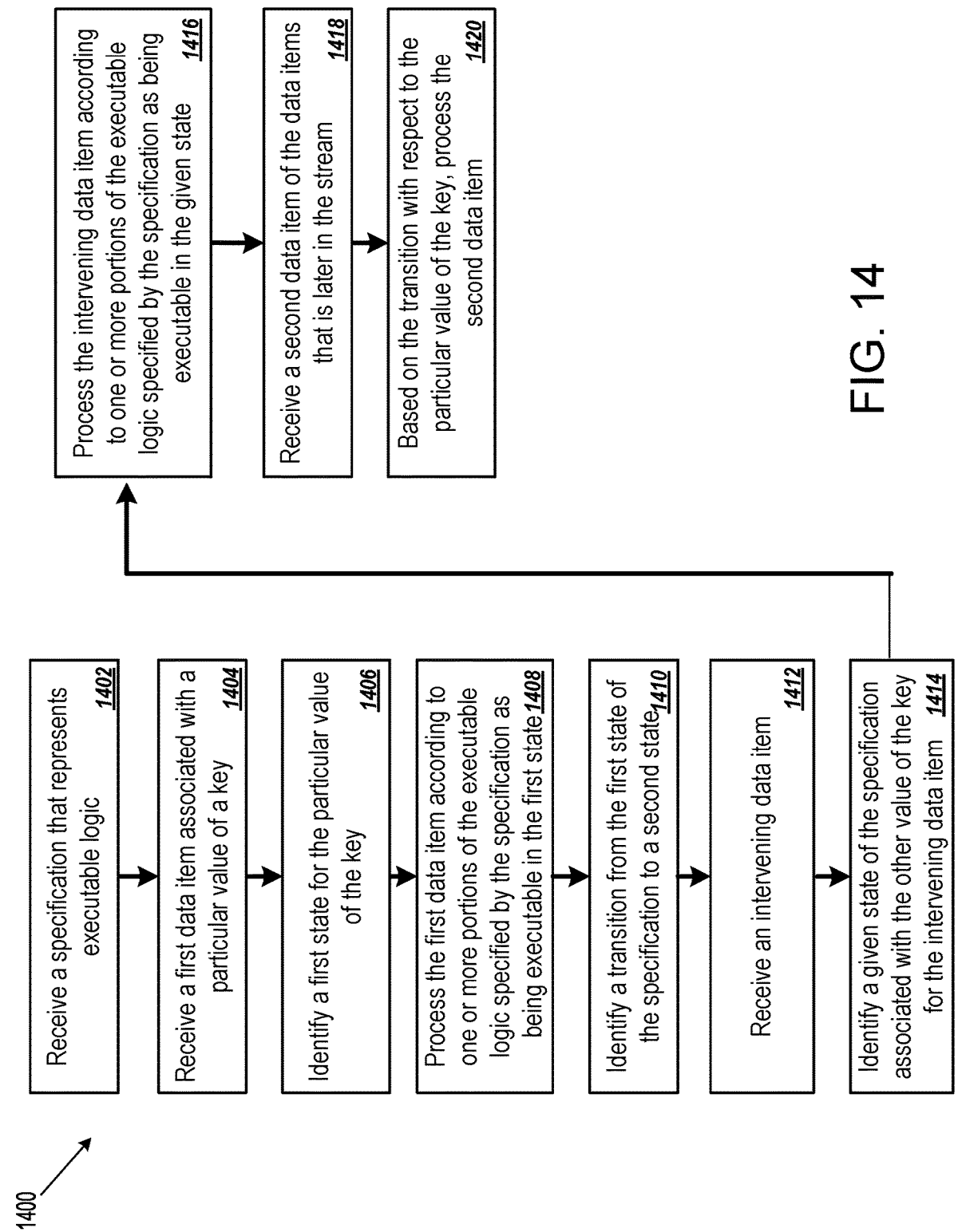

Referring to FIG. 14, the system implements process 1400 in processing data items of a stream of data according to a specification that is associated with a key and that represents executable logic for processing the data items. In this example, a data item is associated with a value of the key. The system maintains (e.g., in an in-memory data grid) states for a plurality of values of the key.

In operation, the system accesses (1402) the specification. A state of the specification represents one or more portions of the executable logic that are executable in that state. The system receives (1404) a first data item of the data items. The data items may be part of an incoming data stream, e.g., data items received via a network connection. The first data item is associated with a particular value of the key. The system identifies (1406) a first state for the particular value of the key. The system processes (1408) the first data item according to (e.g., by executing) one or more portions of the executable logic specified by the specification as being executable in the first state. The system identifies (1410) a transition, with respect to the particular value of the key, from the first state of the specification to a second state in which one or more other portions of the executable logic are executable. The system receives (1412) an intervening data item that is associated with another value of the key that differs from the particular value of the key and is not associated with the particular value of the key. The system identifies (1414) a given state of the specification associated with the other value of the key for the intervening data item. The system processes (1416) the intervening data item according to one or more portions of the executable logic specified by the specification as being executable in the given state. The system receives (1418) a second data item of the data items that is later in the stream than the first data item and the intervening data item and that is also associated with the particular value of the key. Based on the transition of the specification with respect to the particular value of the key, the system processes (1420) the second data item according to one or more portions of the executable logic specified by the specification as being executable in the second state. The one or more portions of the executable logic that are executable in the second state differ from the one or more portions of the executable logic that are executable in the first state. For example, the one or more portions of the executable logic that are executable in a second state represented by nodes 2d, 2e, 2f (FIG. 1A) differ from the one or more portions of the executable logic that are executable in a first state represented by nodes 2a, 2b, 2c (FIG. 1A).

Referring to FIG. 15, the system implements process 1500 for implementing a state machine that is configured to process, for each value of a key, data records that are associated with that value. In operation, the system displays (1502), in one or more editor interfaces, (i) a chart with nodes and one or more links, and (ii) one or more portions for inputting or editing one or more logical expressions in relation to one or more of the nodes. In this example, the one or more of the nodes correspond to a particular state of the state machine. For example, a decision node represents a particular state in which the executable logic implements a decision. In another example, a wait node and another node, which specifies one or more actions to perform following the wait, represent another state of the state machine. In this example, a logical expression represents at least partial processing of a data record when the state machine is in the particular state. There are various types of logical expressions, including, e.g., expressions specifying types of data records for which the system should wait for and one or more actions to be performed upon detection of a data record for which the system is waiting. In this example, a link between one of the nodes and another one of the nodes represents a transition of the state machine from one state to another state.

The system transforms (1504) the one or more logical expressions and the chart into executable logic for implementing a state machine. Based on execution of the executable logic for implementing the state machine and as data records are intermittently received, the system evaluates (1506) one or more fields in the data records to identify values of the key. For each value of the key, the system processes (1508) one or more first data records including one or more fields on which that value of the key is based, with the processing being in accordance with one or more logical expressions that are in relation to one or more nodes corresponding to a current state of the state machine, with respect to that value of the key. In some examples, the system performs this processing as data records are intermittently received. For each value of the key, the system also transitions (1510), in accordance with a link of the chart, to another state for processing one or more second data records of the intermittently received data records, wherein the one or more second data records include the one or more fields on which that value of the key is based, and wherein the one or more second data records are received after the one or more first data records. In some examples, the system performs this transition as data records are intermittently received.

In some examples, the system saves and stores, in a data repository, data indicative of a state of the executable logic, for each value of the key. Then, when the system detects additional data records associated with a same value of the key, the system performs a database lookup to identify a state of the executable logic, for that value of the key. Based on the state of the executable logic for that value of the key, the system determines whether there is further processing to be performed on the data records in that state or whether to transition to a new, next state. By maintaining state for each value of the key, rather than executing the executable logic for each value of the key, the system conserves system resources (e.g., such as memory and processing power). Additionally, once the executable logic transitions to a new state for a particular value of the key, the system deletes from memory the value of the old state, thereby reducing the total amount of memory required for execution and implementation of the state machine.

Additionally, the one or more portions for inputting or editing one or more logical expressions in relation to one or more of the nodes allow for more increased flexibility in configuring and editing a state machine, e.g., such as a keyed state machine, relative to flexibility of editing the state machine independent of or without the portions for inputting or editing. Rather than extensive modeling and configuration of the various states and relationships among states in advance of launching the state machine, the editing interface described herein provides for implementation of a state machine that can be launched without such in advance tasks and instead configured on-the-fly.

Using the techniques described herein, a system provides a graphical programming model for near real-time processing of data records that are separated in time. This processing is key-based processing, as the data records are processed based on a key. In an example, the data records associated with a particular value for the key are analyzed and processed together. Additionally, the system provides for temporal focused testing by displaying result data indicative of results applying the executable logic defined in a chart to data records received by the system. This result data may be displayed in the chart, with each item of result data be displayed in juxtaposition to a node in the chart for which the result data is generated. Additionally, the system also provides the user with a more granular view by allowing the user to step through test results for values of a key for a chart. In this example, the system provides, e.g., as an overlay to the chart, results of executing the executable logic on data records associated with a particular value of the key.

The techniques described above can be implemented using software for execution on a computer. For instance, the software forms procedures in one or more computer programs that execute on one or more programmed or programmable computer systems (which can be of various architectures such as distributed, client/server, or grid) each including at least one processor, at least one data storage system (including volatile and non-volatile memory and/or storage elements), at least one input device or port, and at least one output device or port. The software can form one or more modules of a larger program, for example, that provides other services related to the design and configuration of charts and flowcharts. The nodes, links and elements of the chart can be implemented as data structures stored in a computer readable medium or other organized data conforming to a data model stored in a data repository.

The techniques described herein can be implemented in digital electronic circuitry, or in computer hardware, firmware, software, or in combinations thereof. An apparatus can be implemented in a computer program product tangibly embodied or stored in a machine-readable storage device (e.g., a non-transitory machine-readable storage device, a machine-readable hardware storage device, and so forth) for execution by a programmable processor; and method actions can be performed by a programmable processor executing a program of instructions to perform functions by operating on input data and generating output. The embodiments described herein, and other embodiments of the claims and the techniques described herein, can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language.

Processors suitable for the execution of a computer program include, by way of example, both general and special purpose microprocessors, and any one or more processors of any kind of digital computer. Generally, a processor will receive instructions and data from a read-only memory or a random-access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Computer readable media for embodying computer program instructions and data include all forms of non-volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in special purpose logic circuitry. Any of the foregoing can be supplemented by, or incorporated in, ASICs (application-specific integrated circuits).

To provide for interaction with a user, embodiments can be implemented on a computer having a display device, e.g., a LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments can be implemented in a computing system that includes a back end component, e.g., as a data server, or that includes a middleware component, e.g., an application server, or that includes a front end component, e.g., a client computer having a graphical user interface or a Web browser through which a user can interact with an implementation of embodiments, or any combination of such back end, middleware, or front end components. The components of the system can be interconnected by any form or medium of digital data communication, e.g., a communication network. Examples of communication networks include a local area network (LAN) and a wide area network (WAN), e.g., the Internet.

The system and method or parts thereof may use the "World Wide Web" (Web or WWW), which is that collection of servers on the Internet that utilize the Hypertext Transfer Protocol (HTTP). HTTP is a known application protocol that provides users access to resources, which may be information in different formats such as text, graphics, images, sound, video, Hypertext Markup Language (HTML), as well as programs. Upon specification of a link by the user, the client computer makes a TCP/IP request to a Web server and receives information, which may be another Web page that is formatted according to HTML. Users can also access other pages on the same or other servers by following instructions on the screen, entering certain data, or clicking on selected icons. It should also be noted that any type of selection device known to those skilled in the art, such as check boxes, drop-down boxes, and the like, may be used for embodiments using web pages to allow a user to select options for a given component. Servers run on a variety of platforms, including UNIX machines, although other platforms, such as Windows 2000/2003, Windows NT, Sun, Linux, and Macintosh may also be used. Computer users can view information available on servers or networks on the Web through the use of browsing software, such as Firefox, Netscape Navigator, Microsoft Internet Explorer, or Mosaic browsers. The computing system can include clients and servers. A client and server are generally remote from each other and typically interact through a communication network. The relationship of client and server arises by virtue of computer programs running on the respective computers and having a client-server relationship to each other.

Other embodiments are within the scope and spirit of the description and the claims. For example, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

A number of embodiments of the invention have been described. Nevertheless, it will be understood by one of ordinary skill in the art that various modifications may be made without departing from the spirit and scope of the claims and the techniques described herein.

What is claimed is:

1. A method implemented by a data processing system for processing data items of a stream of data items according to a specification that is associated with a key, wherein a data item is associated with a value of the key, wherein states of the specification are maintained for respective values of the key, wherein the specification represents executable logic being stored in a data storage system, the method including:
  accessing the specification that represents the executable logic, wherein a state of the specification for a particular value of the key specifies one or more portions of the executable logic that are executable in that state;
  receiving, over an input device or port, data items of a stream of data;
  for a first one of the data items of the stream, identifying a first state of the specification for a value of the key associated with that first one of the data items;

processing, by the data processing system, the first one of the data items according to one or more portions of executable logic that are represented in the specification as being associated with the first state, the processing including:

causing display of one or more portions of the specification;

applying the one or more portions of the executable logic to the first one of the data items to obtain result data;

causing display of at least a portion of the result data with at least one of the one or more portions of the specification displayed; and causing the specification, with respect to the value of the key for the first one of the data items, to transition from the first state to a second state.

2. The method of claim 1, further including:
executing the executable logic.

3. The method of claim 1, wherein the one or more portions of the executable logic include one or more first portions of the executable logic, wherein the one or more portions of the specification include a first portion of the specification, wherein the result data includes first result information, the method including:

executing the executable logic;

as the executable logic continues being executed, receiving a second one of the data items that is later in the stream than the first one of the data items and is also associated with the value of the key;

based on the transition from the first state to the second state, processing the second one of the data items according to one or more second portions of the executable logic associated with the second state, wherein the one or more second portion of the executable logic are expressed as a second portion of the specification;

based on the processing, obtaining second result data indicative of one or more results of processing the second one of the data items; and causing display of at least a portion of the second result data with the second portion of the specification.

4. The method of claim 1, including:
accessing sets of items of test data; and
from a selected one of the sets, simulating a stream of near real-time test data having a first item of test data that appears before a second item of test data.

5. The method of claim 4, wherein receiving the stream of data items includes receiving the simulated stream.

6. The method of claim 1, including:
testing a degree of accuracy of execution of a rule expressed by the specification by applying the one or more portions of the executable logic to the first one of the data items.

7. The method of claim 6,
wherein the testing of a degree of accuracy of execution of a rule includes one or more of determining that a portion of the first one of the data items is not processed by the data processing system, determining that a conflict between portions of the rule exist, determining that a portion of the rule specifies a condition that is unlikely to be satisfied for the first one of the data items, and determining that a portion of the rule processes a portion of the first one of the data items in a manner that differs from a targeted processing goal.

8. The method of claim 4, wherein the value of the key includes a first value, and wherein the method includes:
selecting, from the sets of test data, a set associated with a second value of the key; and
executing, on a stream being simulated using test data in the set for the second key, an instance of the executable logic for the second value of the key.

9. The method of claim 1, including:
causing display of a visual representation of a transition from the portion of the specification that represents the first state of the executable logic to the other portion of the specification that represents the second state.

10. The method of claim 1, further including:
receiving a user selection of the first one of the data items of the stream;
causing display of an indication of the first one of the data items of the stream currently being processed by the data processing system; and
causing display of an indication of the one or more portions of the executable logic currently being applied to the first one of the data items to obtain the result data.

11. The method of claim 1, further including:
comparing the portion of the result data with predetermined reference data;
determining if a deviation exists between the portion of the result data and the predetermined reference data or if such a deviation does not exist; and
outputting an indication whether the portion of the result data is in agreement with the predetermined reference data based on the determining if a deviation exists between the portion of the result data and the predetermined reference data or if such a deviation does not exist.

12. The method of claim 10, further including:
comparing the first one of the data items of the stream currently being processed by the data processing system with a predetermined reference data item;
determining if a deviation exists between the first one of the data items of the stream currently being processed and the predetermined reference data item or if such a deviation does not exist; and
outputting an indication whether the first one of the data items of the stream currently being processed is in agreement with the predetermined reference data item based on the determining if a deviation exists between the first one of the data items of the stream currently being processed and the predetermined reference data item or if such a deviation does not exist.

13. The method of claim 10, further including:
comparing the one or more portions of the executable logic currently being applied to the first one of the data items to obtain the result data with a predetermined reference executable logic;
determining if a deviation exists between the one or more portions of the executable logic currently being applied to the first one of the data items and the predetermined reference executable logic or if such a deviation does not exist; and
outputting an indication whether the or more portions of the executable logic currently being applied to the first one of the data items to obtain the result data is in agreement with the predetermined reference executable logic based on the determining if a deviation exists between the one or more portions of the executable logic currently being applied to the first one of the data items and the predetermined reference executable logic or if such a deviation does not exist.

14. A method implemented by a data processing system for processing data items of a stream of data items according to a specification that is associated with a key, wherein a data item is associated with a value of the key, wherein states of the specification are maintained for respective values of the key, and wherein the specification represents executable logic being stored in a data storage system, the method including:
- accessing the specification that represents the executable logic, wherein a state of the specification for a particular value of the key specifies one or more portions of the executable logic that are executable in that state;
- receiving, over an input device or port, data items of a stream of data;
- for a first one of the data items of the stream, identifying a value of the key associated with that first one of the data items;
- identifying that the specification is associated with a wait state for that value of the key, wherein the wait state includes a state in which the executable logic is configured to wait for one or more data items that are associated with that value of the key and that are separated in time from one or more other data items that are located before the one or more data items in the stream;
- processing, with at least one processor, the first one of the data items according to one or more portions of executable logic that are represented in the specification as being associated with the wait state; and
- causing display of at least a portion of data indicative of a result of the processing of the first one of the data items according to one or more portions of executable logic associated with the wait state.

15. The method of claim 14, wherein the specification includes a flowchart with a plurality of nodes, wherein at least one of the nodes includes a wait node that represents the wait state, and wherein the flowchart includes a link between a first one of the nodes and a second one of the node, wherein the link represents a transition of the executable logic from executing one or more first portions of the executable logic represented by the first one of the nodes to executing one or more second portions of the executable logic represented by the second one of the nodes.

16. The method of claim 14, including:
- generating data for a graphical user interface that when rendered on a display device includes a start control for executing the flowchart and also includes the flowchart;
- receiving data indicative of selection of the start control;
- responsive to the received data, executing the flowchart by performing operations including:
- executing the one or more first portions of the executable logic represented by the first node on the first one of the data items; and
- causing the graphical user interface to be updated to display result data indicative of a result of processing the first one of the data items with the one or more first portions of the executable logic represented by the first node, wherein the result data is displayed in juxtaposition to the first node in the flowchart.

17. The method of claim 14, wherein the data for the graphical user interface includes data for displaying a stop control, the method including:
- receiving data indicative of a selection of the stop control; and
- pausing execution of the flowchart.

18. A method performed by a data processing system for implementing a state machine, wherein the state machine is configured to process, for each value of a key, data records that are associated with that value, the method including:
- displaying, in one or more editor interfaces, (i) a chart with nodes and one or more links, and (ii) one or more portions for inputting or editing one or more logical expressions in relation to one or more of the nodes, wherein the one or more of the nodes correspond to a particular state of the state machine, and wherein a logical expression represents at least partial processing of a data record when the state machine is in the particular state;
- wherein a link between one of the nodes and another one of the nodes represents a transition of the state machine from one state to another state;
- transforming the one or more logical expressions and the chart into executable logic for implementing a state machine for:
  - as data records are intermittently received,
    - evaluating one or more fields in the data records to identify values of the key; and
    - for each value of the key,
      - processing one or more first data records including one or more fields on which that value of the key is based, with the processing being in accordance with one or more logical expressions that are in relation to one or more nodes corresponding to a current state of the state machine, with respect to that value of the key; and
      - transitioning, in accordance with a link of the chart, to another state for processing one or more second data records of the intermittently received data records, wherein the one or more second data records include the one or more fields on which that value of the key is based, and wherein the one or more second data records are received after the one or more first data records.

19. A method implemented by a data processing system to process data items of a stream of data, the processing including:
- receiving a specification that represents executable logic for processing data items of a stream of data, wherein the specification is associated with a key, wherein a data item is associated with a value of the key, and wherein states of the executable logic are maintained for respective values of the key;
- wherein the specification includes nodes and one or more links, one or more first nodes represent a first state of the executable logic, with respect to a value of the key, in which a first portion of the executable logic is executable on a first one of the data items associated with that value of key;
- wherein second nodes represent a second state of the executable logic, with respect to that value of the key, wherein one of the second nodes represents a portion of the executable logic that is configured to wait for a second one of the data items with that value of the key in the second state, wherein the second one of the data items is separated in time from the first one of the data items by being located after the first one of the data items in the stream, wherein another one of the second nodes represents another portion of the executable logic that is configured to cause execution of one or more actions in the second state;
- wherein a link between one of the one or more first nodes and one of the second nodes represents a state transition of the executable logic, with respect to that value of the key, from the first state, in which the first portion is executable, to the second state, in which the executable logic is configured to wait for the second one of the data items; and transforming the specification into executable logic for processing, for each value of the key, data items that are associated with that value and that are separated in time in a stream of data.

20. A method implemented by a data processing system to process data items of a stream of data according to a specification that is associated with a key and that represents executable logic for processing the data items, wherein a data item is associated with a value of the key, wherein states of the specification are maintained for a plurality of values of the key, the processing including:

accessing the specification, wherein a state of the specification represents one or more portions of the executable logic that are executable in that state;

receiving a first data item of the data items, wherein the first data item is associated with a particular value of the key;

identifying a first state for the particular value of the key;

processing the first data item according to one or more portions of the executable logic specified by the specification as being executable in the first state;

identifying a transition, with respect to the particular value of the key, from the first state of the specification to a second state in which one or more other portions of the executable logic are executable;

receiving an intervening data item that is associated with another value of the key that differs from the particular value of the key and is not associated with the particular value of the key;

identifying a given state of the specification associated with the other value of the key for the intervening data item;

processing the intervening data item according to one or more portions of the executable logic specified by the specification as being executable in the given state;

receiving a second data item of the data items that is later in the stream than the first data item and the intervening data item and that is also associated with the particular value of the key; and based on the transition of the specification with respect to the particular value of the key, processing the second data item according to one or more portions of the executable logic specified by the specification as being executable in the second state, wherein the one or more portions of the executable logic that are executable in the second state differ from the one or more portions of the executable logic that are executable in the first state.

* * * * *

UNITED STATES PATENT AND TRADEMARK OFFICE
CERTIFICATE OF CORRECTION

PATENT NO. : 10,579,753 B2
APPLICATION NO. : 15/376129
DATED : March 3, 2020
INVENTOR(S) : Joel Gould, Scott Studer and Craig W. Stanfill Page 1 of 1

It is certified that error appears in the above-identified patent and that said Letters Patent is hereby corrected as shown below:

In the Claims

Column 52, Line 59, Claim 13, after "the", insert -- one --

Signed and Sealed this
Fifth Day of May, 2020

Andrei Iancu
*Director of the United States Patent and Trademark Office*